(12) United States Patent
Kim et al.

(10) Patent No.: US 9,916,900 B2
(45) Date of Patent: Mar. 13, 2018

(54) MEMORY DEVICE, MEMORY SYSTEM, METHOD OF OPERATING MEMORY DEVICE, AND METHOD OF OPERATING MEMORY SYSTEM

(71) Applicants: Yoon Kim, Yongin-si (KR); Dong-chan Kim, Seoul (KR); Ji-sang Lee, Iksan-si (KR)

(72) Inventors: Yoon Kim, Yongin-si (KR); Dong-chan Kim, Seoul (KR); Ji-sang Lee, Iksan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/245,162

(22) Filed: Aug. 23, 2016

(65) Prior Publication Data

US 2017/0062059 A1    Mar. 2, 2017

(30) Foreign Application Priority Data

Aug. 25, 2015 (KR) .................. 10-2015-0119816

(51) Int. Cl.
| | |
|---|---|
| G11C 11/56 | (2006.01) |
| G11C 16/14 | (2006.01) |
| G11C 16/34 | (2006.01) |
| G11C 16/10 | (2006.01) |
| G11C 16/04 | (2006.01) |

(52) U.S. Cl.
CPC .......... *G11C 16/14* (2013.01); *G11C 16/107* (2013.01); *G11C 16/349* (2013.01); *G11C 11/5635* (2013.01); *G11C 16/0483* (2013.01)

(58) Field of Classification Search
CPC .................... G11C 11/5635; G11C 16/14
USPC ........................ 365/185.29, 185.17
See application file for complete search history.

(56) References Cited

U.S. PATENT DOCUMENTS

| | | | |
|---|---|---|---|
| 7,679,133 | B2 | 3/2010 | Son et al. |
| 7,929,351 | B2 | 4/2011 | Seol et al. |
| 8,199,579 | B2 | 6/2012 | Shiino et al. |
| 8,553,466 | B2 | 10/2013 | Han et al. |
| 8,553,467 | B2 | 10/2013 | Shimura et al. |
| 8,559,235 | B2 | 10/2013 | Yoon et al. |
| 8,593,882 | B2 | 11/2013 | Park |
| 8,654,587 | B2 | 2/2014 | Yoon et al. |
| 8,842,477 | B2 | 9/2014 | Parker |
| 8,891,312 | B2 | 11/2014 | Lee et al. |

(Continued)

FOREIGN PATENT DOCUMENTS

| | | |
|---|---|---|
| JP | 200193287 A | 4/2001 |
| KR | 100685643 B1 | 2/2007 |

*Primary Examiner* — Jason Lappas
(74) *Attorney, Agent, or Firm* — Renaissance IP Law Group LLP

(57) ABSTRACT

A memory device, comprising: a memory cell array including a plurality of NAND strings, each NAND string including a plurality of memory cells respectively connected to a plurality of word lines vertically stacked on a substrate; and a control logic configured to generate a pre-programming control signal for memory cells of a first NAND string of the NAND strings such that, before erasing the memory cells of the first NAND string, pre-programming voltages applied to the word lines coupled to the corresponding memory cells of the first NAND string vary based on an operating characteristic of the corresponding memory cells.

19 Claims, 41 Drawing Sheets

(56) References Cited

U.S. PATENT DOCUMENTS

| | | | |
|---|---|---|---|
| 2008/0123436 A1* | 5/2008 | Byeon | G11C 11/5635 |
| | | | 365/185.29 |
| 2011/0204420 A1 | 8/2011 | Kim et al. | |
| 2011/0233648 A1 | 9/2011 | Seol et al. | |
| 2012/0051138 A1 | 3/2012 | Kim et al. | |
| 2014/0104950 A1 | 4/2014 | Yano | |
| 2014/0297924 A1 | 10/2014 | Sanda et al. | |
| 2015/0131381 A1* | 5/2015 | Rhie | G11C 16/14 |
| | | | 365/185.17 |

* cited by examiner

MEMORY DEVICE, MEMORY SYSTEM, METHOD OF OPERATING MEMORY DEVICE, AND METHOD OF OPERATING MEMORY SYSTEM

CROSS-REFERENCE TO RELATED APPLICATION

This application claims the benefit of Korean Patent Application No. 10-2015-0119816, filed on Aug. 25, 2015, in the Korean Intellectual Property Office, the disclosure of which is incorporated herein in its entirety by reference.

BACKGROUND

Embodiments relate to a memory device, and more particularly, to a memory device including a three-dimensional (3D) memory array, a memory system, a method of operating the memory device, and a method of operating the memory system.

Memory devices are used to store data and are categorized into volatile memory devices and nonvolatile memory devices. As an example of the nonvolatile memory devices, a flash memory device may be used in portable phones, digital cameras, personal digital assistants (PDAs), mobile computer devices, fixed computer devices, and other devices.

SUMMARY

Some embodiments include a memory device, comprising: a memory cell array including a plurality of NAND strings, each NAND string including a plurality of memory cells respectively connected to a plurality of word lines vertically stacked on a substrate; and a control logic configured to generate a pre-programming control signal for memory cells of a first NAND string of the NAND strings such that, before erasing the memory cells of the first NAND string, pre-programming voltages applied to the word lines coupled to the corresponding memory cells of the first NAND string vary based on an operating characteristic of the corresponding memory cells.

Some embodiments include a memory system comprising: a memory device including a memory cell array including a plurality of strings each including a plurality of memory cells respectively connected to a plurality of word lines; and a memory controller configured to control the memory device to pre-program memory cells of a first string before erasing the memory cells of the first string based on an operating characteristic of the memory cells of the first string.

Some embodiments include a method of operating a memory device which includes a plurality of strings each including a plurality of memory cells respectively connected to a plurality of word lines, the method comprising: pre-programming memory cells respectively connected to at least some of the word lines by respectively applying pre-programming voltages to the at least some word lines that vary based on operating characteristics of memory cells coupled to the at least some of the plurality of word lines; and performing an erase operation on the plurality of memory cells.

Some embodiments include a memory device, comprising: a plurality of memory cells, at least one memory cell having a structurally based operating characteristic different from another of the memory cells; a plurality of word lines, each word line coupled to a corresponding one of the memory cells; and a controller configured to apply pre-programming voltages to the word lines based on the operating characteristics of the memory cells.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
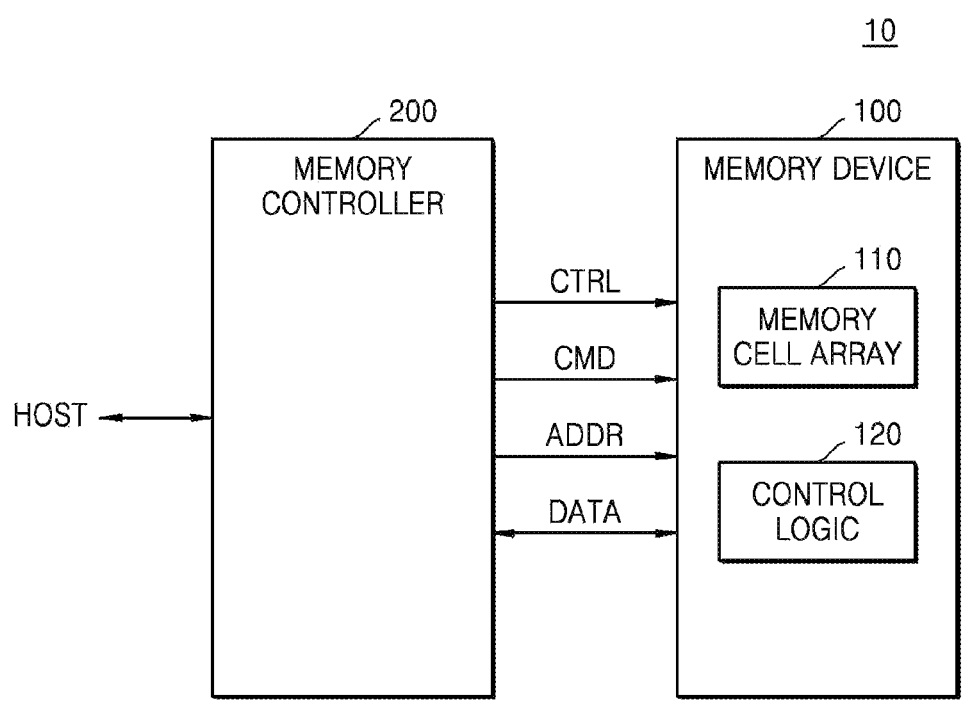
FIG. 1 is a block diagram schematically illustrating a memory system according to an embodiment.

Hereinafter, embodiments will be described in detail with reference to the accompanying drawings. Embodiments are provided so that this disclosure will be thorough and complete, and will fully convey the concept to one of ordinary skill in the art. Since the embodiments may have diverse modified embodiments, particular embodiments are illustrated in the drawings and are described in the detailed description as examples. However, this does not limit embodiments to the particular embodiments and it should be understood that embodiments include all the modifications, equivalents, and replacements within the idea and technical scope. Like reference numerals refer to like elements throughout. In the drawings, the dimensions and size of each structure are exaggerated, reduced, or schematically illustrated for convenience in description and clarity.

The terms used in this application to describe particular embodiments are not intended to limit all embodiments. In the following description, the technical terms are used to explain a particular embodiment may or may not limit other embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Terms like a first and a second may be used to describe various elements, but the elements should not be limited by the terms. The terms may be used only to distinguish an element from another element. For example, a first element may be referred to as a second element, and similarly, the second element may be referred to as the first element.

As used herein, the term "and/or" includes any and all combinations of one or more of the associated listed items. Expressions such as "at least one of" when preceding a list of elements, modify the entire list of elements and do not modify the individual elements of the list.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the terms "substantially the same" or "substantially similar" indicate a relationship that is the same or similar with respect to particular characteristics but may also include variations that do not depart from the character of the particular characteristics. For example, dimensions, locations, magnitudes of values, or the like may be the substantially the same yet still include manufacturing process variations, variations within mechanical tolerances, or the like.

FIG. 1 is a block diagram schematically illustrating a memory system 10 according to an embodiment. Referring to FIG. 1, the memory system 10 may include a memory device 100 and a memory controller 200, and the memory device 100 may include a memory cell array 110 and control logic 120.

The memory controller 200 may be configured to control the memory device 100 to read data stored in the memory device 100 or write data in the memory device 100 in response to a read/write request from a host. In detail, the memory controller 200 may be configured to provide an address ADDR, a command CMD, and a control signal CTRL to the memory device 100 to control a program (or write) operation, a read operation, and an erase operation which are performed for the memory device 100. Also, data DATA for the program operation and read data DATA may be transmitted or received between the memory controller 200 and the memory device 100.

Although not shown, the memory controller 200 may include a random access memory (RAM), a processing unit, a host interface, and a memory interface. The RAM may be used as a working memory of the processing unit, and the processing unit may control an operation of the memory controller 200. The host interface may include a protocol for data exchange between the host and the memory controller 200. For example, the memory controller 200 may be configured to communicate with an external device (HOST) through at least one of various interface protocols such as universal serial bus (USB), multimedia card (MMC), PCI express (PIC-E), advanced technology attachment (ATA), serial-ATA, parallel-ATA, small computer system interface (SCSI), enhanced small disk interface (ESDI), integrated drive electronics (IDE), or the like.

The memory cell array 110 may include multiple memory cells, and for example, the memory cells may be flash memory cells. Hereinafter, a case where the memory cells are NAND flash memory cells will be described as an example of some embodiments. However, other embodiments are not limited thereto. In other embodiments, the memory cells may be resistive memory cells such as resistive RAMs (RRAMs), phase change RAMs (PRAMs), magnetic RAMs (MRAMs), or the like.

The memory cell array 110 may include multiple NAND strings, and each of the NAND strings may include multiple memory cells respectively connected to multiple word lines which are vertically stacked on a substrate. As described above, in an embodiment, the memory cell array 110 may be a 3D memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as multiple levels, with word lines and/or bit lines shared between levels: U.S. Pat. Nos. 7,679,133; 8,553,466; 8,654,587; 8,559,235; and US Pat. Pub. No. 2011/0233648. Also, U.S. Pat. Pub. Nos. 2012/0051138 and 2011/0204420 are incorporated herein by reference. However, in other embodiments, the three-dimensional memory arrays may have different configurations.

The control logic 120 may be configured to control elements included in the memory device 100 to perform the pre-program operation on at least some of multiple memory cells before performing the erase operation on the memory cells. In the present specification, in order to perform the pre-program operation, the control logic 120 may be configured to generate a pre-programming control signal for individually controlling the pre-program operation on at least some memory cells, based on a distance between the substrate and each of multiple word lines.

In detail, the control logic 120 may be configured to generate the pre-programming control signal for controlling a voltage (hereinafter referred to as a pre-programming voltage), which is supplied to each of the word lines while the pre-program operation is being performed. Therefore, the control logic 120 may be configured to perform control to cause different pre-programming voltages to be respectively applied to the word lines while the pre-program operation is being performed. In some embodiments, the control logic 120 may be configured to perform control so that application durations and/or levels of voltages respectively applied to the word lines differ.

Here, the pre-program operation denotes an operation that shifts threshold voltages of the memory cells to an arbitrary voltage level higher than that of an erased-state threshold voltage by applying a pre-programming voltage to the memory cells before performing the erase operation, for preventing the memory cells from being over-erased (or deep-erased) by a repetitive erase operation. In this case, the pre-programming voltage may be equal to or lower than a programming voltage used for a normal program operation. Hereinafter, the pre-program operation will be described with reference to FIGS. 2 and 3.

Figure 2:
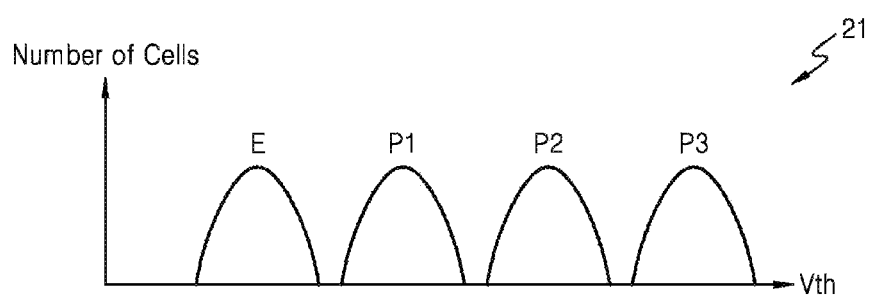
FIG. 2 is a graph showing a memory cell distribution change obtained through repetitive erase operations.
Figure 2:
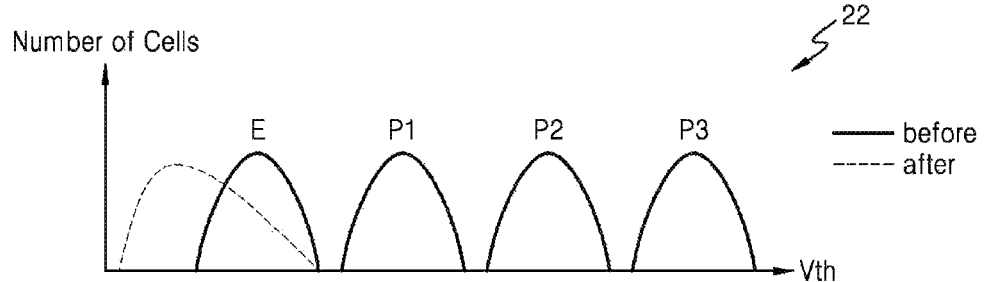

FIG. 2 is a graph showing a memory cell distribution change obtained through repetitive erase operations. Referring to FIG. 2, reference numeral "21" corresponds to an initial memory cell distribution based on a threshold voltage, the abscissa axis indicates a threshold voltage "Vth", and the ordinate axis indicates the number of memory cells. For example, when a memory cell is a multi-level cell which is programmed by two bits, the memory cell may be in one of an erase state E, a first program state P1, a second program state P2, and a third program state P3.

Reference numeral "22" corresponds to a memory cell distribution obtained through changing by a repetitive erase operation, the abscissa axis indicates a threshold voltage "Vth", and the ordinate axis indicates the number of memory cells. When the erase operation is repeatedly performed without performing the pre-program operation on the memory cells before performing the erase operation, an erase voltage that is a high voltage may be applied to a memory cell in the erase state E. Therefore, as illustrated as a dotted line, over-erasure where threshold voltages of some memory cells become lower than an initial erase state E occurs.

A trap may be generated in a gate insulation layer due to the over-erasure, and for this reason, a corresponding memory cell is deteriorated. Also, electrons stored in the charge trap layer may move to the substrate in the erase operation, and holes of the substrate may move to the charge trap layer. In this case, holes may be excessively accumulated in the charge trap layer due to the over-erasure, and for this reason, a retention characteristic of an adjacent cell is deteriorated.

Figure 3:
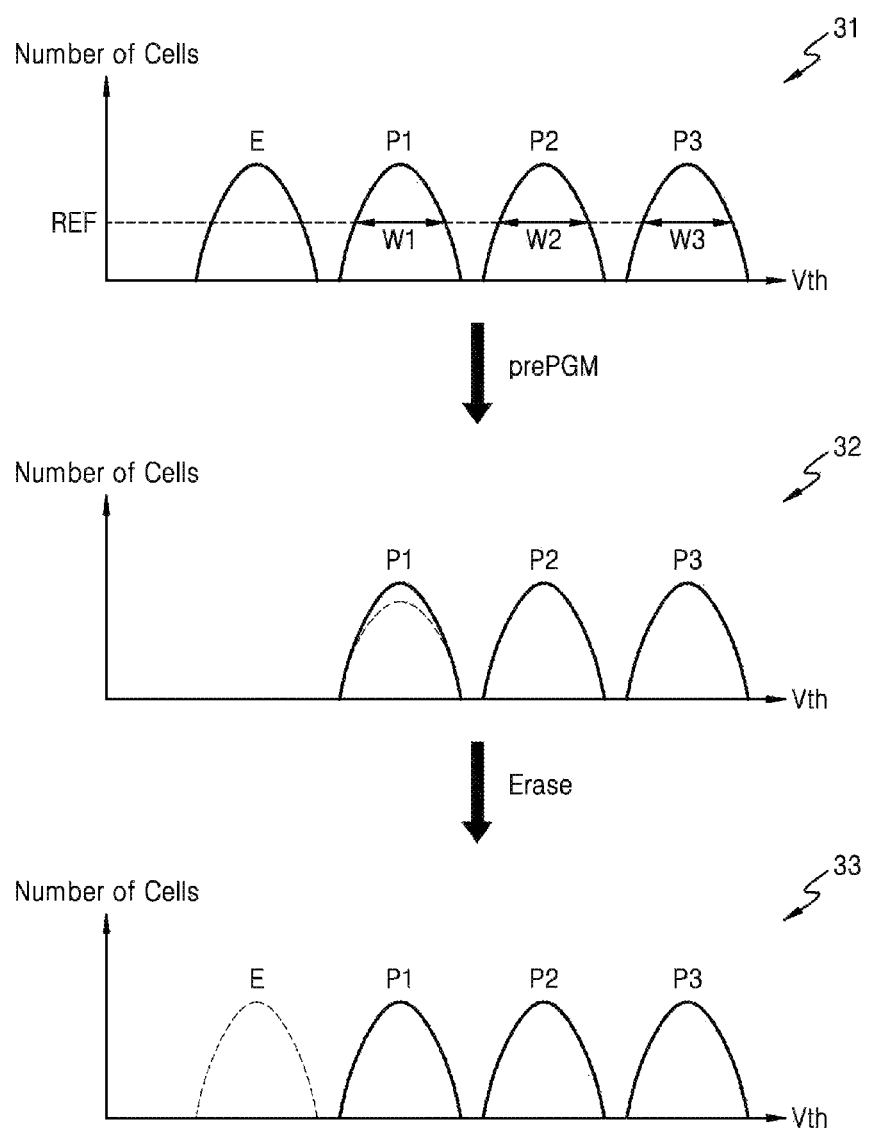
FIG. 3 is a graph showing a memory cell distribution obtained by sequentially performing a pre-program operation and an erase operation.

FIG. 3 is a graph showing a memory cell distribution obtained by sequentially performing a pre-program operation and an erase operation. Referring to FIG. 3, reference numeral "31" corresponds to an initial memory cell distribution based on a threshold voltage, reference numeral "32" corresponds to a memory cell distribution when the pre-program operation is performed, and reference numeral "33" corresponds to a memory cell distribution when the erase operation is performed.

To prevent the memory cells from being over-erased, the pre-program operation of increasing threshold voltages of the memory cells by applying a weak programming voltage (i.e., a pre-programming voltage) to the memory cells may be performed before performing the erase operation. For example, memory cells in the erase state E may be put in the first program state P1 by the pre-program operation. In other words, memory cells in the erase state E referred to by reference numeral "31" may be put in the first program state P1 as illustrated as a dotted line in reference numeral "32".

Subsequently, unlike reference numeral "22" of FIG. 2, by performing the erase operation on memory cells for which the pre-program operation has been performed, memory cells corresponding to reference numeral "33" may be put in the erase state E substantially similar to the initial memory cell distribution referred to by reference numeral "31" without being over-erased. Therefore, pre-programmed memory cells illustrated as a dotted line in reference numeral "32" may be in the erase state E illustrated as a dotted line in reference numeral "33".

Figure 4:
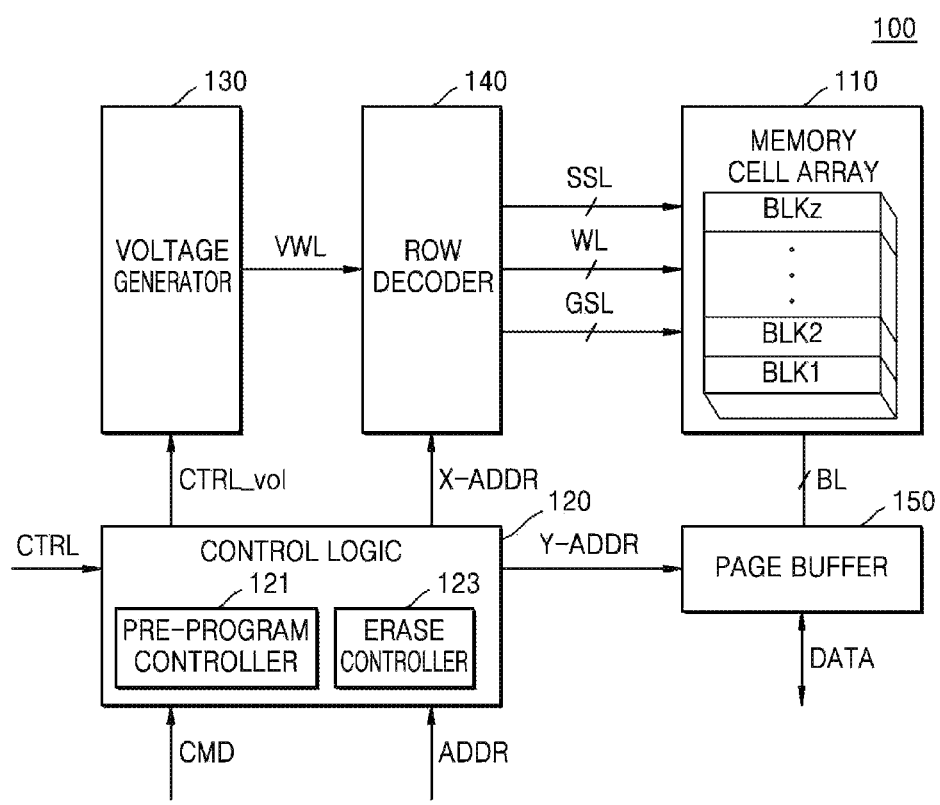
FIG. 4 is a block diagram illustrating in detail an example of a memory device illustrated in FIG. 1.

FIG. 4 is a block diagram illustrating in detail an example of the memory device 100 illustrated in FIG. 1. Referring to FIG. 4, the memory device 100 may include the memory cell array 110, the control logic 120, a voltage generator 130, a row decoder 140, and a page buffer 150. Although not shown, the memory device 100 may further include a data input/output (I/O) circuit, an input/output (I/O) interface, and/or other circuits.

The memory cell array 110 may include multiple memory cells and may be connected to multiple word lines WL, multiple string selection lines SSL, multiple ground selection lines GSL, and multiple bit lines BL. In detail, the memory cell array 110 may be connected to the row decoder 140 through the word lines WL, the string selection lines SSL, and the ground selection lines GSL and may be connected to the page buffer 150 through the bit lines BL.

The memory cell array 110 may include multiple blocks BLK1 to BLKz, and each of the blocks BLK1 to BLKz may have a three-dimensional (3D) structure (or a vertical structure). In detail, each of the blocks BLK1 to BLKz may include multiple structures which extend along first to third directions. For example, each of the blocks BLK1 to BLKz may include multiple NAND strings in an array in the first and second directions where each of the NAND strings extends along the third direction. In this case, the NAND strings may be provided to be spaced apart from each other by a certain distance along the first and second directions. The blocks BLK1 to BLKz may be selected by the row decoder 140. For example, the row decoder 140 may select a block corresponding to a block address from among the blocks BLK1 to BLKz.

The memory cell array 110 may include at least one of a single level cell block including multiple single level cells, a multi-level cell block including multiple multi-level cells, and a triple level cell block including multiple triple level cells. In other words, some of the blocks included in the memory cell array 110 may be single level cell blocks, and the other blocks may be multi-level cell blocks or triple level cell blocks. In other embodiments, other types of cell blocks may be included.

The control logic 120 may be configured to write data in the memory cell array 110 or read data from the memory cell array 110, based on the command CMD, the address ADDR, and the control signal CTRL received from the memory controller 200. Therefore, the control logic 120 may be configured to overall control various operations of the memory device 100.

Various control signals output from the control logic 120 may be supplied to the voltage generator 130, the row decoder 140, and the page buffer 150. For example, the control logic 120 may be configured to supply a voltage control signal CTRL_vol to the voltage generator 130, supply a row address X-ADDR to the row decoder 140, and supply a column address Y-ADDR to the page buffer 150. However, other embodiments are not limited thereto. In other embodiments, the control logic 120 may be configured to further supply other control signals and/or different control signals to the voltage generator 130, the row decoder 140, and the page buffer 150.

In this embodiment, the control logic 120 may include a pre-program controller 121 and an erase controller 123. The pre-program controller 121 may be configured to generate a pre-programming control signal to cause the pre-program operation to be performed on some of memory cells for which the erase operation is to be performed. The erase controller 123 may be configured to generate an erase control signal to cause the erase operation to be performed on memory cells after the pre-program operation is performed. However, a configuration of the control logic 120 is not limited thereto. In some embodiments, the pre-program controller 121 and the erase controller 123 may be implemented as one function block.

In some embodiments, the control logic 120 may be configured to sequentially receive a pre-program command and an erase command from the memory controller 200, and thus, the pre-program controller 121 may be configured to generate the pre-programming control signal and then the erase controller 123 may be configured to generate the erase control signal. In some embodiments, the control logic 120 may be configured to receive the erase command from the memory controller 200, and thus, the pre-program controller 121 may be configured to first generate the pre-programming control signal and then the erase controller 123 may be configured to generate the erase control signal.

The pre-program controller 121 may be configured to generate the pre-programming control signal to cause the pre-program operation to be performed before the erase operation is performed on the memory cell array 110, and control the voltage generator 130, the row decoder 140, and the page buffer 150 according to the generated pre-programming control signal. In this embodiment, the pre-program controller 121 may be configured to individually determine pre-programming voltages respectively supplied to the word lines, based on respective distances between the substrate and the word lines and generate the pre-programming control signal according to the determined pre-programming voltages. Therefore, pre-programming voltages respectively supplied to two adjacent word lines may differ. Also, the pre-program controller 121 may be configured to determine multiple selection voltages which are respectively supplied to a string selection line and a ground selection line while the pre-program operation is being performed, and may further generate the pre-programming control signal according to the determined selection voltages.

In some embodiments, the pre-programming control signal may include a row address X-ADDR having activation times which may differ among the word lines. The pre-program controller 121 may be configured to generate the row address X-ADDR, based on the address ADDR received from the memory controller 200 and the distance between the substrate and each of the word lines and may be configured to supply the generated row address X-ADDR to the row decoder 140. A detailed operation on this will be described below with reference to FIGS. 15 to 18.

In some embodiments, the pre-programming control signal may include a voltage control signal CTRL_vol having voltage levels that may differ among the word lines. The pre-program controller 121 may be configured to generate the voltage control signal CTRL_vol, based on the distance between the substrate and each of the word lines and may be configured to supply the generated voltage control signal CTRL_vol to the voltage generator 130. A detailed operation on this will be described below with reference to FIGS. 10 to 14.

In some embodiments, the pre-program controller 121 may be configured to generate the pre-programming control signal to cause the pre-program operation to be performed on all memory cells to be erased. In some embodiments, the pre-program controller 121 may be configured to generate the pre-programming control signal to cause the pre-program operation to be performed on some of the memory cells which are to be erased.

In some embodiments, the pre-program controller 121 may be configured to generate the pre-programming control signal, based on the pre-program command and the pre-program address. In some embodiments, the pre-program controller 121 may be configured to generate the preprogramming control signal to cause the pre-program operation to be performed on memory cells corresponding to the pre-program address.

In some embodiments, the pre-program controller 121 may be configured to generate the pre-programming control signal, based on the erase command and an erase address. In some embodiments, the pre-program controller 121 may be configured to generate the pre-programming control signal to cause the pre-program operation to be performed on only some of memory cells corresponding to the erase address. In some embodiments, the pre-program controller 121 may be configured to generate the pre-programming control signal to cause the pre-program operation to be performed on all the memory cells corresponding to the erase address.

When the pre-program operation is completed, the erase controller 123 may be configured to generate the erase control signal to cause the erase operation to be performed on the memory cell array 110, and may be configured to control the voltage generator 130, the row decoder 140, and the page buffer 150 according to the generated erase control signal. In this embodiment, the erase controller 123 may be configured to determine a word line erase voltage supplied to each of the word lines and a substrate erase voltage supplied to the substrate and may be configured to generate the erase control signal according to the determined word line erase voltage and substrate erase voltage. Also, the erase controller 123 may be configured to determine multiple selection voltages which are respectively supplied to the string selection line and the ground selection line while the erase operation is being performed, and may be configured to further generate the erase control signal according to the determined selection voltages.

The voltage generator 130 may be configured to generate various kinds of voltages for performing a program operation, a read operation, and the erase operation on the memory cell array 110, based on the voltage control signal CTRL_vol. In detail, the voltage generator 130 may be configured to generate a word line voltage, for example, a programming voltage (or a write voltage), a pre-programming voltage, a read voltage, a program inhibit voltage, a read inhibit voltage, an erase verification voltage, a program verification voltage, or the like. Also, the voltage generator 130 may be configured to further generate a string selection line voltage and a ground selection line voltage, based on the voltage control signal CTRL_vol. Also, the voltage generator 130 may be configured to further generate an erase voltage which is to be supplied to the memory cell array 110.

In this embodiment, the voltage generator 130 may be configured to generate multiple voltages having different voltage levels, based on the voltage control signal CTRL_vol. The voltage generator 130 may be configured to supply the generated voltages to corresponding word lines. For example, the voltage generator 130 may be configured to include multiple voltage generation units, and thus may be configured to generate the voltages. Alternatively, the voltage generator 130 may be configured to divide a voltage to generate the voltages. In other embodiments, the voltage generator 130 may be configured to generate the voltages in other ways.

The row decoder 140 may be configured to select some word lines from among the word lines WL in response to the row address X-ADDR received from the control logic 120. In detail, in the pre-program operation, the row decoder 140 may be configured to apply a pre-programming voltage to a selected word line and may be configured to apply the program inhibit voltage to an unselected word line. Also, the row decoder 140 may be configured to select some string selection lines from among the string selection lines SSL and may be configured to select some ground selection lines from among the ground selection lines GSL in response to the row address X-ADDR received from the control logic 120.

In this embodiment, in a pre-program period, the row decoder 140 may be configured to apply different pre-programming voltages to multiple word lines. For example, the row decoder 140 may be configured to supply a first pre-programming voltage to a first word line adjacent to the substrate and may be configured to supply a second pre-programming voltage to a second word line disposed over the first word line. In some embodiments, a first application duration of the first pre-programming voltage may be shorter than a second application duration of the second pre-programming voltage. In some embodiments, a first voltage level of the first pre-programming voltage may be lower than a second voltage level of the second pre-programming voltage.

The page buffer 150 may be connected to the memory cell array 110 through the bit lines BL, and may be configured to select some bit lines from among the bit lines BL in response to the column address Y-ADDR received from the control logic 120. In detail, in the read operation, the page buffer 150 may be configured to operate as a sense amplifier to sense data DATA stored in the memory cell array 110. In the program operation, the page buffer 150 may be configured to operate as a write amplifier to input data DATA, which is to be stored, to the memory cell array 110.

Figure 5:
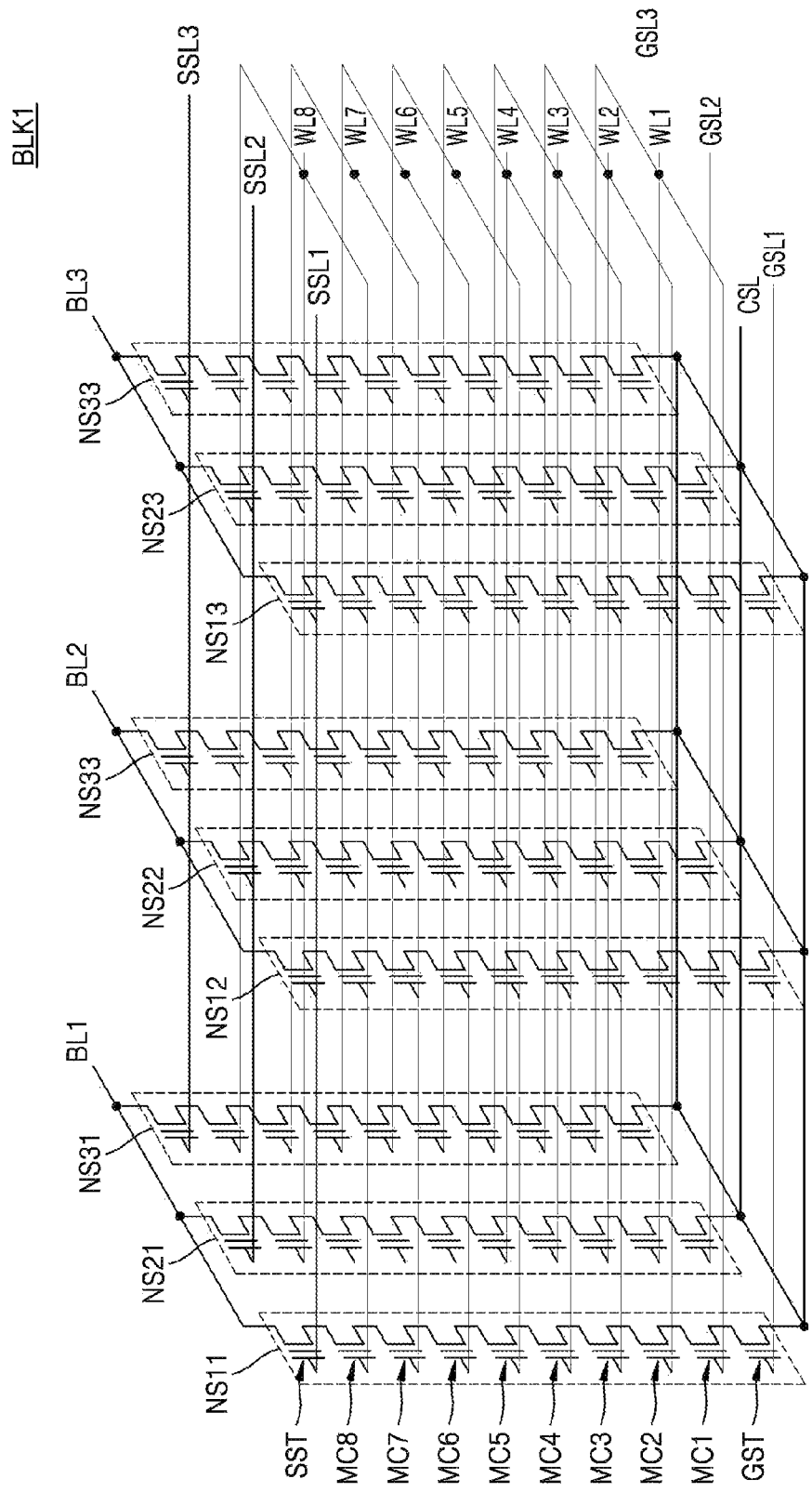
FIG. 5 is a circuit diagram illustrating an example of an equivalent circuit of a first block which is one of multiple blocks illustrated in FIG. 4.

FIG. 5 is a circuit diagram illustrating an example of an equivalent circuit of a first block BLK1 illustrated in FIG. 4. Referring to FIG. 5, the first block BLK1 may be a NAND flash memory having a vertical structure, and each of the blocks BLK1 to BLKz illustrated in FIG. 4 may be implemented as illustrated in FIG. 5. The first block BLK1 may include multiple NAND strings NS11 to NS33, multiple word lines WL1 to WL8, multiple bit lines BL1 to BL3, multiple ground selection lines GSL1 to GSL3, multiple string selection lines SSL1 to SSL3, and a common source line CSL. Here, the number of the NAND strings, the number of the word lines, the number of the bit lines, the number of the ground selection lines, and the number of the string selection lines may are merely examples and may be different in other embodiments.

The NAND strings NS11, NS21 and NS31 may be disposed between a first bit line BL1 and the common source line CSL, the NAND strings NS12, NS22 and NS32 may be disposed between a second bit line BL2 and the common source line CSL, and the NAND strings NS13, NS23 and NS33 may be provided between a third bit line BL1 and the common source line CSL. Each of the NAND strings (for example, NS11) may include a string selection transistor SST, multiple memory cells MC1 to MC8, and a ground selection transistor GST which are connected in series. Hereinafter, for convenience, the NAND string is referred to as a string.

Multiple strings that are connected to one bit line in common may form one column. For example, the strings NS11, NS21 and NS31, which are connected to the first bit line BL1 in common, may form a first column, the strings NS12, NS22 and NS32, which are connected to the second bit line BL2 in common, may form a second column, and the strings NS13, NS23 and NS33, which are connected to the third bit line BL3 in common, may form a third column.

Multiple strings connected to one string selection line may form one row. For example, the strings NS11, NS12 and NS13 connected to a first string selection line SSL1 may form a first row, the strings NS21, NS22 and NS23 connected to a second string selection line SSL2 may form a second row, and the strings NS31, NS32 and NS33 connected to a third string selection line SSL3 may form a third row.

The string selection transistor SST may be connected to a corresponding string selection line among the string selection lines SSL1 to SSL3. The memory cells MC1 to MC8 may be respectively connected to the word lines WL1 to WL8 corresponding to thereto. The ground selection transistor GST may be connected to a corresponding ground selection line among the ground selection lines GSL1 to GSL3. The string selection transistor SST may be connected to a corresponding bit line among the bit lines BL1 to BL3, and the ground selection transistor GST may be connected to the common source line CSL.

In this embodiment, word lines (for example, WL1) having the same height may be connected in common, the string selection lines SSL1 to SSL3 may be separated from each other, and the ground selection lines GSL1 to GSL3 may also be separated from each other. For example, when memory cells that are connected to the first word line WL1 and are included in the strings NS11, NS12 and NS13 are programmed, the first word line WL1 and the first string selection line SSL1 may be selected. However, other embodiments are not limited thereto. In other embodiments, the ground selection lines GSL1 to GSL3 may be connected in common.

Figure 6:
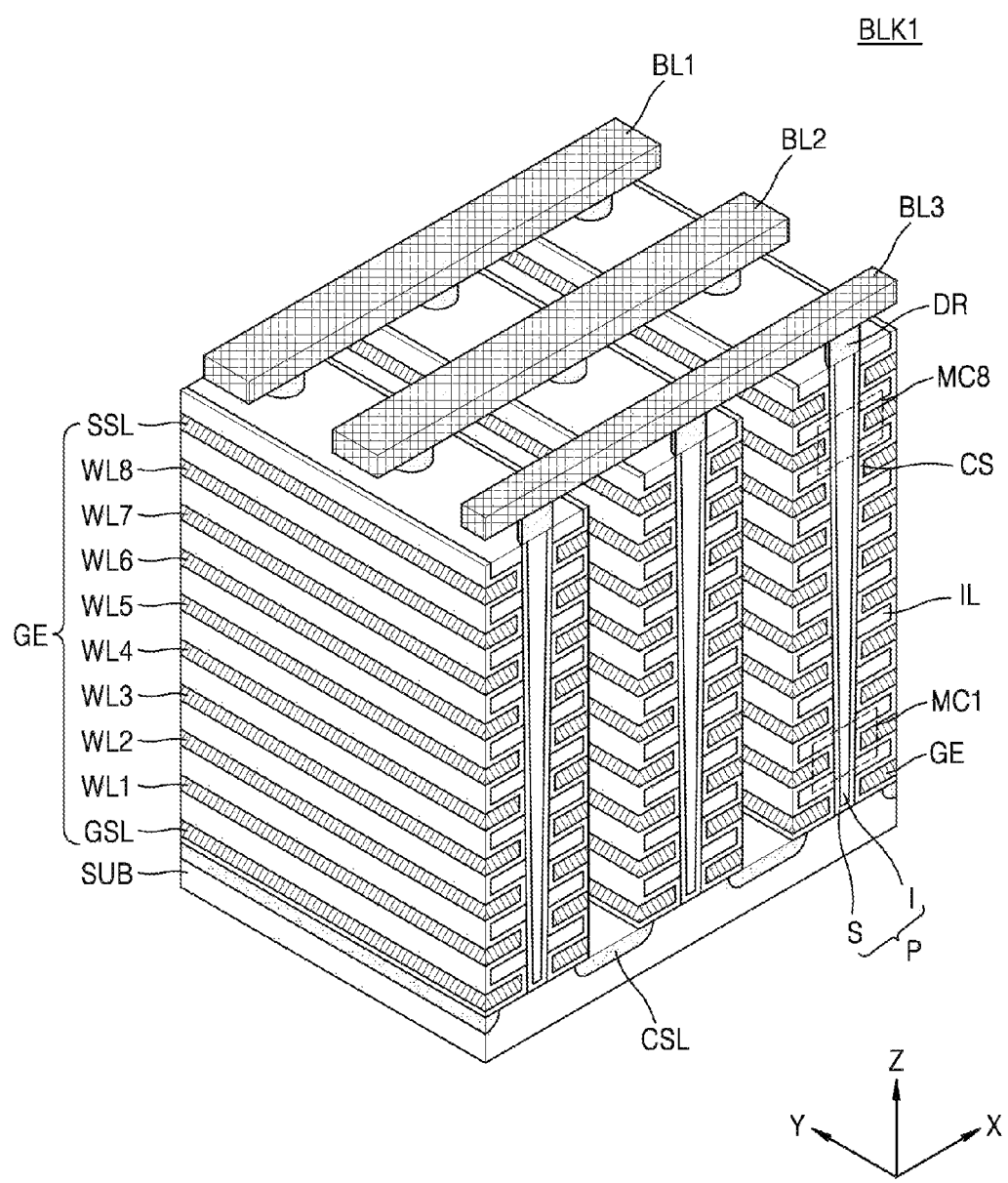
FIG. 6 is a perspective view illustrating an example of the first block which is one of the blocks illustrated in FIG. 4.

FIG. 6 is a perspective view illustrating an example of the first block BLK1 which is one of the blocks illustrated in FIG. 4. Referring to FIG. 6, the first block BLK1 may be formed in a vertical direction with respect to a substrate SUB. In FIG. 6, the first block BLK1 is illustrated as including two selection lines GSL and SSL, eight word lines WL1 to WL8, and three bit lines BL1 to BL3. However, other embodiments may include a greater or smaller number of lines.

The substrate SUB may have a first conductivity type (for example, a p type), and a common source line CSL that extends along a first direction (for example, a Y direction) and on which impurities having a second conductivity type (for example, an n type) are doped may be disposed on the substrate SUB. Multiple insulation layers IL, which extend along the first direction, may be sequentially disposed along a third direction (for example, a Z direction) in a region of the substrate SUB between two adjacent common source lines CSL, and may be spaced apart from each other by a certain distance along the third direction. For example, the insulation layers IL may each include an insulating material such as silicon oxide and/or the like.

Multiple pillars P which are sequentially disposed along the first direction and pass through the insulation layers IL along the third direction may be disposed in the region of the substrate SUB between the two adjacent common source lines CSL. For example, the pillars P may pass through the insulation layers IL and contact the substrate SUB. In detail, a surface layer S of each of the pillars P may include silicon having a first type and may function as a channel region. An inner layer I of each of the pillars P may include an insulating material, such as silicon oxide and/or the like, or an air gap.

A charge storage layer CS may be disposed in a region between two adjacent common source lines CSL along the insulation layers IL, the pillars P, and an exposed surface of the substrate SUB. The charge storage layer CS may include a gate insulation layer (or may be referred to as a tunneling insulation layer), a charge trap layer, and a blocking insulation layer. For example, the charge storage layer CS may have an oxide-nitride-oxide (ONO) structure. Also, multiple gate electrodes such as the selection lines GSL and SSL and the word lines WL1 to WL8 may be disposed on an exposed surface of the charge storage layer CS and in a region between two adjacent common source lines CSL.

Multiple drains or multiple drain contacts DR may be provided on the pillars P, respectively. For example, the drains or the drain contacts DR may each include silicon on which impurities having the second conductive type are doped. The bit lines BL1 to BL3 which extend in a second direction (for example, an X direction) and are disposed to be spaced apart from each other by a certain distance along the first direction may be disposed on the drain contacts DR.

Figure 7A:
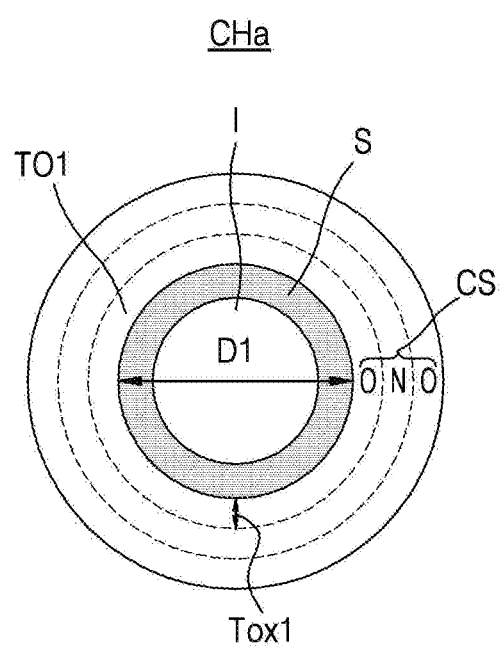
FIG. 7A illustrates a cross-sectional surface of a first channel hole corresponding to a first memory cell of FIG. 6.
Figure 7B:
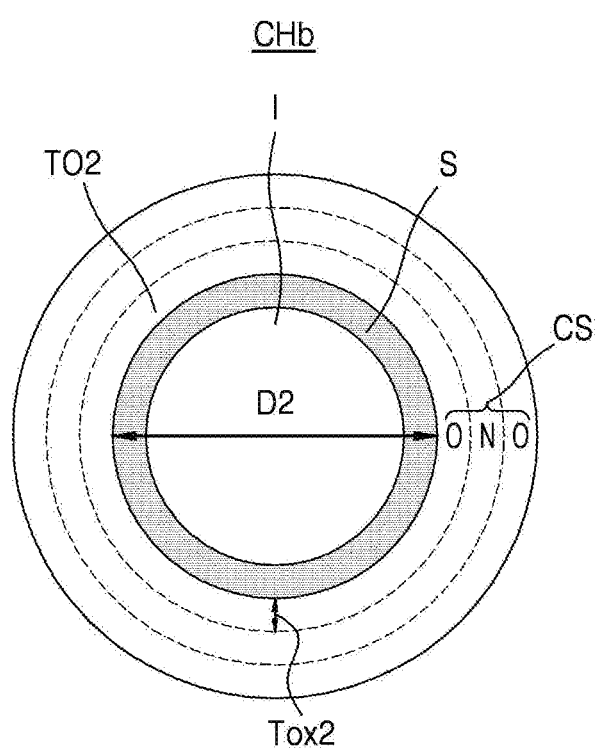
FIG. 7B illustrates a cross-sectional surface of a second channel hole corresponding to an eighth memory cell of FIG. 6.

FIG. 7A illustrates a cross-sectional surface of a first channel hole CHa corresponding to a first memory cell MC1 of FIG. 6, and FIG. 7B illustrates a cross-sectional surface of a second channel hole CHb corresponding to an eighth memory cell MC8 of FIG. 6. Referring to FIGS. 6 and 7A, a pillar P which includes a surface layer S and an inner layer I may be formed in the first channel hole CHa, and a charge storage layer CS may be formed on a circumference of the first channel hole CHa. The charge storage layer CS may have the ONO structure. In this case, a diameter of the first channel hole CHa may be D1, and a thickness of a first tunneling insulation layer TO1 formed on a circumference of the surface layer S may be Tox1.

Referring to FIGS. 6 and 7B, a pillar P which includes a surface layer S and an inner layer I may be formed in the second channel hole CHb, and a charge storage layer CS may be formed on a circumference of the second channel hole CHb. The charge storage layer CS may have the ONO structure. In this case, a diameter of the second channel hole CHb may be D2, and a thickness of a second tunneling insulation layer TO2 formed on a circumference of the surface layer S may be Tox2.

In some embodiments, D1 may be less than D2. Hereinafter, an operation characteristic difference between memory cells caused by a difference between diameters of channel holes will be described with reference to FIGS. 6, 7A, and 7B. In a three-dimensional (3D) memory device having a round-type gate where a gate electrode GE is disposed on a circumference of a channel hole, when a diameter of the channel hole is reduced, a degree to which electric fields generated from the gate electrode GE to a channel region S focus increases. Accordingly, a speed of each of the program operation and the erase operation becomes faster in a memory cell, where a diameter of a channel hole is smaller like the first channel hole CHa, than in a memory cell where a diameter of a channel hole is larger like the second channel hole CHb.

In some embodiments, Tox1 may be less than Tox2. Hereinafter, an operation characteristic difference between memory cells caused by a difference between thicknesses of tunneling insulation layers will be described with reference to FIGS. 6, 7A, and 7B. Thicknesses and compositions of layers configuring the charge storage layer CS disposed between the gate electrode GE and the channel region S may differ depending on diameters of channel holes. In depositing the charge storage layer CS having the ONO structure, deposition areas and deposition surface roughness of the channel holes may differ depending on diameters of the channel holes, and thus, a speed at which a deposition gas contact a deposition surface and is deposited may change according to the diameter. In a case where the tunneling insulation layer is thinned, when the same voltage is applied to the tunneling insulation layer, a stronger magnetic field may be generated. Accordingly, a speed of each of the program operation and the erase operation becomes faster in a memory cell where a thickness of a tunneling insulation layer is thinner like a first tunneling insulation layer TO1 than another memory cell where a thickness of a tunneling insulation layer is thicker like a second tunneling insulation layer TO2.

As described above, in a bottom memory cell connected to a lower word line closer to the substrate, due to a diameter of a channel hole which is relatively smaller or a thickness of a tunneling insulation layer which is relatively thinner, when the same voltage as a voltage applied to an upper word line is applied to the lower word line, an electric field which is stronger than an electric field applied to an upper memory cell may be applied to the bottom memory cell. Therefore, when the pre-program operation is performed by using the same pre-programming voltage, stress caused by application of a pre-programming voltage is more severe in a bottom memory cell than an upper memory cell, and for this reason, the bottom memory cell may be more quickly deteriorated than the upper memory cell.

Figure 8:
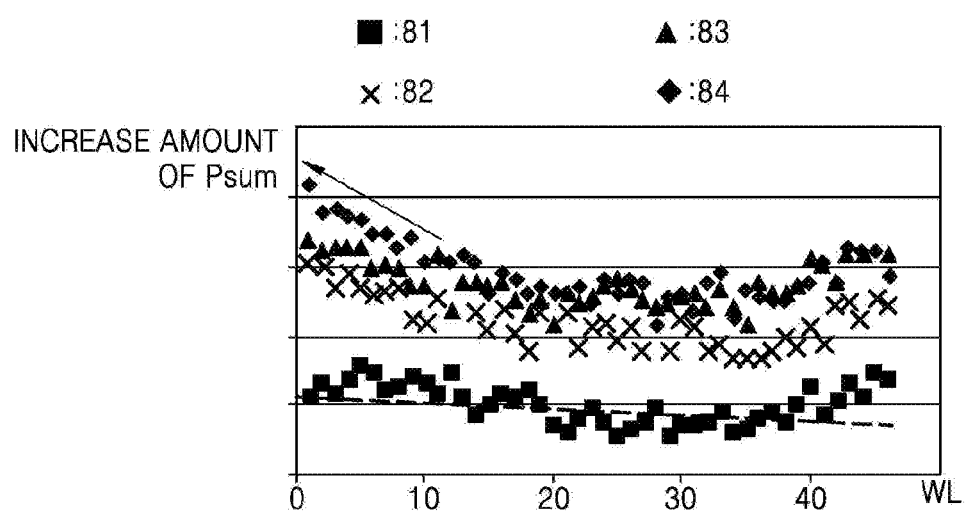
FIG. 8 is a graph showing an increase amount of a program distribution width based on a level of a word line.

FIG. 8 is a graph showing an increase amount of a program distribution width based on a level of a word line. Referring to FIG. 8, the abscissa axis indicates a level of a word line, and the ordinate axis indicates an increase amount of a program distribution width Psum. Here, the program distribution width Psum may be a sum of distribution widths of program states corresponding to a reference memory cell number. For example, the program distribution width Psum may be a sum of distribution widths of first to third program states P1 to P3 corresponding to the reference memory cell number, and in FIG. 3, may be Psum=W1+W2+W3. However, other embodiments are not limited thereto. In other embodiments, the program distribution width Psum may be a distribution width of a program state corresponding to the reference memory cell number. For example, the program distribution width Psum may be a distribution width of the first program state P1 corresponding to the reference memory cell number, and in FIG. 3, may be Psum=W1.

Moreover, the increase in the amount of the program distribution width Psum denotes a change in an amount of a program distribution width based on an increase in program/ erase cycle count. For example, the increase in the amount of the program distribution width Psum may be a change in the amount of a program distribution width Psum1 when the program/erase cycle count is 1, and may be a change in the amount of a program distribution width Psum2 when the program/erase cycle count is 2,000.

Reference numeral "81" indicates an increase in the amount of a program distribution width when the erase operation is performed without performing the pre-program operation. A programming voltage may be additionally applied to a memory cell in performing the pre-program operation, and thus, when the erase operation is performed without performing the pre-program operation, the number of times a programming voltage is applied to a memory may be relatively small. Therefore, the incidence of deterioration of memory cells caused by application of the programming voltage may be relatively low in terms of endurance. Accordingly, an increase amount of a program distribution width Psum may be relatively small.

Reference numerals "82 to 84" each indicate a change in the amount of a program distribution width when the erase operation is performed after performing the pre-program operation. Reference numeral "82" indicates a change in the amount of a program distribution width when the pre-program operation is performed by using a first pre-programming voltage. Reference numeral "83" indicates a change in the amount of a program distribution width when the pre-program operation is performed by using a second pre-programming voltage higher in voltage level than the first pre-programming voltage. Reference numeral "84" indicates a change in the amount of a program distribution width when the pre-program operation is performed by using a third pre-programming voltage higher in voltage level than the second pre-programming voltage.

When the erase operation is performed after performing the pre-program operation, over-erasure may be reduced, but the number of times a programming voltage is applied to a memory may relatively increase. Therefore, the incidence of deterioration of memory cells caused by application of the programming voltage may be relatively high in terms of endurance, and thus, an increase in the amount of a program distribution width Psum may be relatively large. Particularly, as a pre-programming voltage becomes higher, an increase in the amount of a program distribution width may further increase.

Moreover, when the same pre-programming voltage is applied to memory cells, an increase in the amount of a program distribution width corresponding to a lower word line where a level of a word line is low may be larger than an increase in the amount of a program distribution width corresponding to an upper word line where a level of a word line is higher. As described above with reference to FIGS. 7A and 7B, this is because in a lower memory cell connected to a lower word line, a diameter of a channel width is relatively smaller and a thickness of a tunneling insulation layer is relatively thinner, and thus, stress caused by the same pre-programming voltage is larger in the lower memory cell than an upper memory cell.

As described above, problems caused by over-erasure may be reduced or eliminated by performing the pre-program operation. However, the incidence of deterioration of memory cells caused by application of a pre-programming voltage may become higher in terms of endurance, and particularly, the incidence of deterioration of bottom memory cells may further increase. According to some embodiments, by individually controlling the pre-program operation according to a level of a word line (i.e., a distance between the substrate and each word line), an operation characteristic difference of memory cells caused by a difference between the geometric shapes of the memory cells may be compensated for. Hereinafter, a method of operating the memory device according to an embodiment will be described in detail with reference to FIG. 9.

Figure 9:
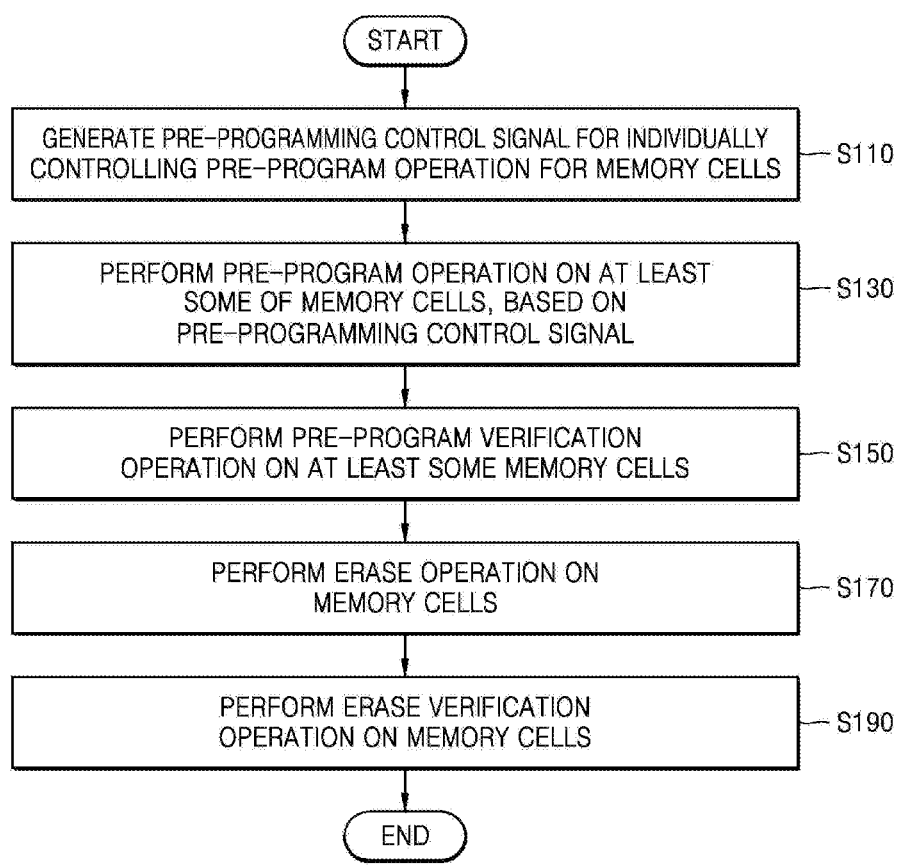
FIG. 9 is a flowchart illustrating a method of operating a memory device according to some embodiments.

FIG. 9 is a flowchart illustrating a method of operating a memory device according to some embodiments. Referring to FIG. 9, the method according to this embodiment may be a method which is performed in memory device when a command and an address are received from a memory controller, and for example, may include operations which are sequentially performed in the memory device 100 of FIG. 4. The details described above with reference to FIGS. 1 to 8 may be applied to this and other embodiments, and repetitive descriptions are not repeated.

In operation S110, a pre-programming control signal is generated for individually controlling the pre-program operation for memory cells. For example, the pre-program controller 121 may individually determine pre-programming voltages respectively supplied to word lines, based on levels of the word lines, thereby generating the pre-programming control signal. In some embodiments, when a pre-program command is received from the memory controller 200, the pre-program controller 121 may generate the pre-programming control signal. In some embodiments, when an erase command is received from the memory controller 200, the pre-program controller 121 may first generate the pre-programming control signal.

In operation S130, a pre-program operation is performed on at least some of the memory cells, based on the pre-programming control signal. In some embodiments, the pre-programming control signal may include the voltage control signal having voltage levels which differ according to the word lines, and the voltage generator 130 may generate pre-programming voltages having different voltage levels according to the voltage control signal. In some embodiments, the pre-programming control signal may include the row address having activation times which differ according to the word lines, and the row decoder 140 may supply a pre-programming voltage to a corresponding word line for different application durations according to the row address.

In operation S150, a pre-program verification operation is performed on the at least some memory cells. For example, the pre-program verification operation may be performed by applying a pre-program verification voltage to word lines. When threshold voltages of the memory cells are lower than a reference voltage as a result of the verification, operation S130 may be performed, and otherwise, operation S170 may be performed. However, other embodiments are not limited thereto. In other embodiments, operation S150 may be omitted.

In operation S170, an erase operation is performed on the memory cells. For example, the erase controller 123 may determine the word line erase voltage, the substrate erase voltage, and the selection line voltage to generate the erase control signal. The voltage generator 130 may generate the word line erase voltage, the substrate erase voltage, and the selection line voltage according to the erase control signal. The erase operation may be performed on the memory cells by using the generated word line erase voltage, substrate erase voltage, and selection line voltage.

In operation S190, an erase verification operation is performed on the memory cells. For example, the erase verification operation may be performed on the memory cells by applying the erase verification voltage to the word lines. When the erase operation on the memory cells is not completed as a result of the verification, operation S170 may be repeated, and otherwise, the method may end.

Figure 10:
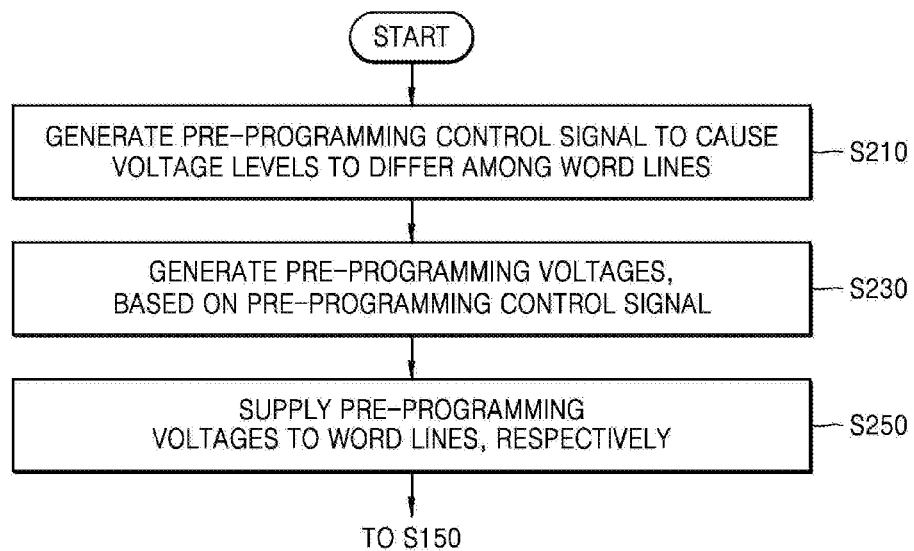
FIG. 10 is a flowchart illustrating a pre-program operation method of a memory device according to some embodiments.

FIG. 10 is a flowchart illustrating a pre-program operation method of a memory device according to some embodiments. Referring to FIG. 10, the pre-program operation method according to the present embodiment is a detailed example of operations S110 and S130 of FIG. 9. The details described above with reference to FIG. 9 may be applied to the present embodiment, and repetitive descriptions are not repeated.

In operation S210, a pre-programming control signal is generated to cause voltage levels to differ by word lines. For example, the pre-program controller 121 may generate the pre-programming voltage control signal to cause a first voltage level of a first pre-programming voltage, supplied to a first word line closer to the substrate, to be lower than a second voltage level of a second pre-programming voltage supplied to a second word line disposed over the first word line.

However, other embodiments are not limited thereto. In other embodiments, when a memory cell array includes multiple memory blocks which are vertically arranged, a voltage level of a pre-programming voltage supplied to a lower word line of an upper block may be lower than that of a pre-programming voltage supplied to an upper word line of a bottom block. This will be described below with reference to FIGS. 24 and 25.

In operation S230, multiple pre-programming voltages are generated based on the pre-programming control signal. In detail, the voltage generator 130 may generate the pre-programming voltages having different voltage levels in response to the pre-programming control signal.

In operation S250, the pre-programming voltages are respectively supplied to multiple word lines. For example, the row decoder 140 may supply a corresponding pre-programming voltage to each of the word lines in response to a row address.

Figure 11A:
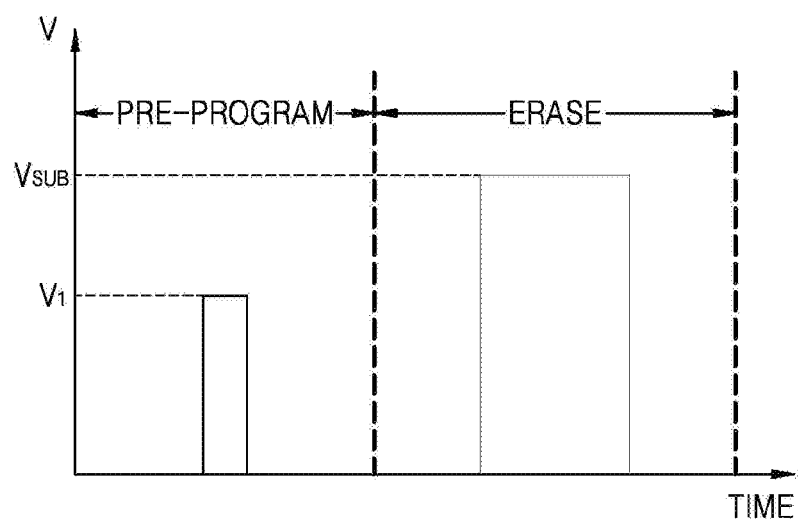
FIGS. 11A and 11B are graphs respectively showing a voltage applied to a bottom memory cell and a voltage applied to an upper memory cell when a pre-program operation and an erase operation according to some embodiments are performed.
Figure 11B:
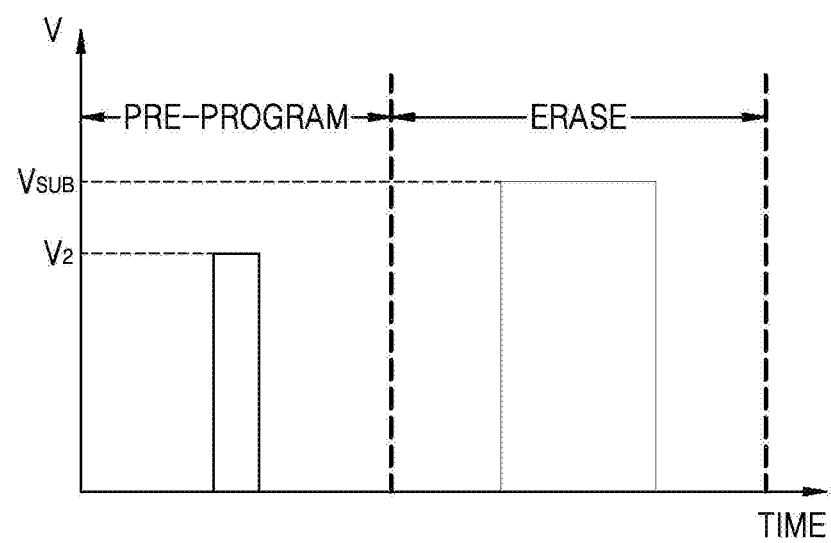

FIGS. 11A and 11B are graphs respectively showing a voltage applied to a bottom memory cell and a voltage applied to an upper memory cell when a pre-program operation and an erase operation according to some embodiments are performed. Referring to FIG. 11A, the abscissa axis indicates a time, and the ordinate axis indicates a voltage. For example, a lower memory cell may be a first memory cell connected to a first word line relatively close to the substrate. In a pre-program period, a first pre-programming voltage $V_1$ may be supplied to the first word line. In this case, a voltage level of the first pre-programming voltage $V_1$ may be equal to or lower than that of a programming voltage for programming a memory cell to a first program state (for example, P1 of FIG. 2), but other embodiments are not limited thereto. Although not shown, subsequently, a pass voltage lower than the first pre-programming voltage $V_1$ may be supplied to the first word line, and subsequently, a pre-program verification voltage may be supplied to the first word line.

In an erase period, an erase voltage $V_{SUB}$ may be supplied to the substrate. A voltage level of the erase voltage $V_{SUB}$ may be higher than that of the first pre-programming voltage $V_1$, and an application duration of the erase voltage $V_{SUB}$ may be longer than an application duration of the first pre-programming voltage $V_1$. Subsequently, although not shown, an erase verification voltage may be supplied to the first word line.

Referring to FIG. 11B, the abscissa axis indicates a time, and the ordinate axis indicates a voltage. An upper memory cell may be a second memory cell connected to a second word line relatively further away from the substrate than the first word line of FIG. 11A. The second word line may be disposed over the first word line, and in an embodiment, another word line may not be disposed between the first word line and the second word line. In other embodiments, other word lines may be disposed between the first word line and the second word line.

In the pre-program period, a second pre-programming voltage $V_2$ may be supplied to the second word line. In this case, a voltage level of the second pre-programming voltage $V_2$ may be higher than that of the first pre-programming voltage $V_1$. Therefore, even when a diameter of a channel hole of the second memory cell is greater than that of a channel hole of the first memory cell or a thickness of a tunneling insulation layer of the second memory cell is thicker than that of a tunneling insulation layer of the first memory cell, an electric field stress applied to the first memory cell may be substantially the same as an electric field stress applied to the second memory cell because the voltage level of the second pre-programming voltage $V_2$ may be higher than that of the first pre-programming voltage $V_1$. Accordingly, a difference in operating characteristics of memory cells caused by a difference between the geometric shapes of the memory cells may be compensated, and additional deterioration of a bottom memory cell may be reduced if not prevented. Also, as a result of the pre-program operation, each of the memory cells has a threshold voltage corresponding to the substantially same program state irrespective of a level.

Although the proximity to the substrate has been used as an example of a parameter to determine whether a higher or lower pre-programming voltage will be used, in other embodiments, different criteria may be used to select the higher or lower pre-programming voltage. For example, any difference in the structure of the memory cells that affects an operating characteristic impacting the effectiveness of a programming voltage may be used to select different pre-programming voltages. That is, the selection of different preprogramming voltages in some embodiments may not be dependent on the distance of a memory cell from the substrate.

Figure 12:
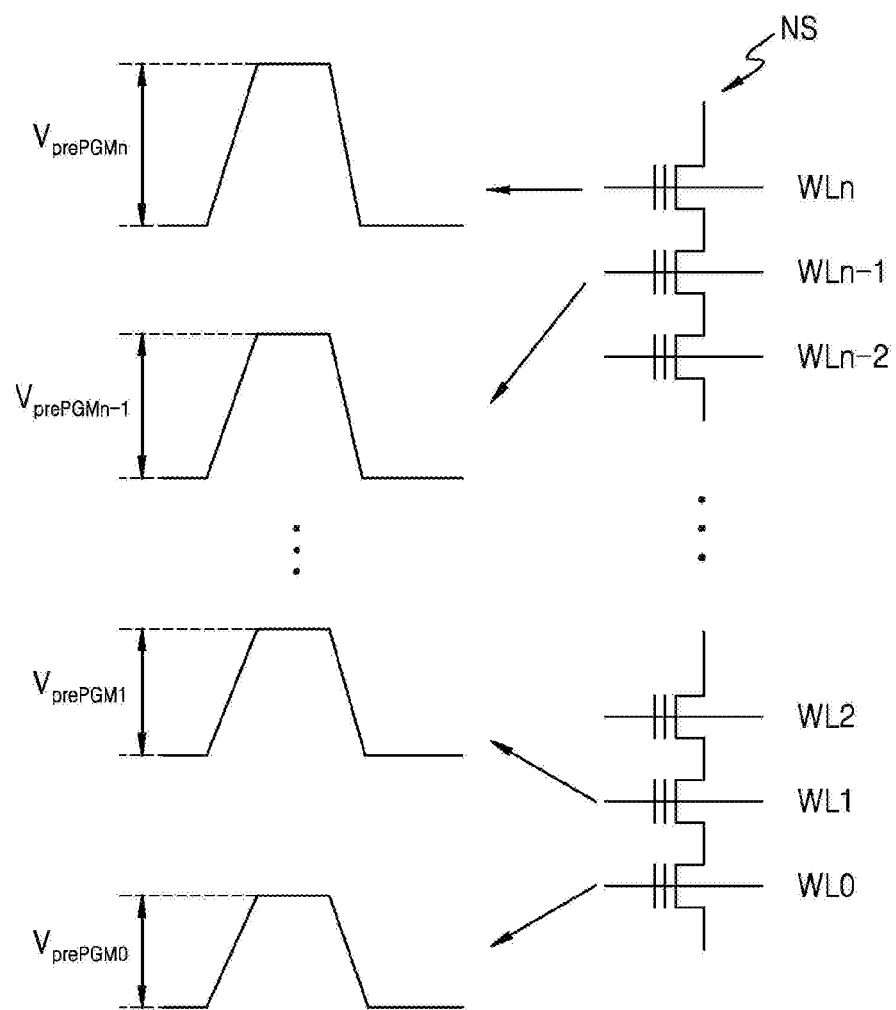
FIG. 12 shows pre-programming voltages respectively applied to multiple word lines connected to a NAND string according to some embodiments.

FIG. 12 shows pre-programming voltages respectively applied to multiple word lines connected to a NAND string according to some embodiments. Referring to FIG. 12, a NAND string NS may include multiple memory cells respectively connected to multiple word lines WL0 to WLn. Although not shown, the NAND string NS may further include a ground selection line and multiple selection transistors connected to the string selection line.

A first pre-programming voltage $V_{prePGM0}$ may be supplied to a first word line WL0, which is a lower word line closer to the substrate among the word lines WL0 to WLn and, a second pre-programming voltage $V_{prePGM1}$ having a voltage level higher than that of the first pre-programming voltage $V_{prePGM0}$ may be supplied to a second word line WL1 above the first word line WL0. Similarly, an n−1st pre-programming voltage $V_{prePGMn-1}$ having a voltage level higher than that of the second pre-programming voltage $V_{prePGM1}$ may be supplied to an (n−1)st word line WLn−1 which is an upper word line farther away from the substrate, and an nth pre-programming voltage $V_{prePGMn}$ having a voltage level higher than that of the (n−1)st pre-programming voltage $V_{prePGMn-1}$ may be supplied to an nth word line WLn above the (n−1)st word line WLn−1.

In this embodiment, voltage levels of pre-programming voltages respectively supplied to the word lines WL0 to WLn connected to the NAND string NS may differ. In this case, application durations of the pre-programming voltages respectively supplied to the word lines WL0 to WLn may be the same.

However, other embodiments are not limited thereto. In other embodiments, the word lines WL0 to WLn connected to the NAND string NS may be grouped into multiple groups. In this case, the same pre-programming voltage may be supplied to word lines within a group while the pre-programming voltages of each group may be different. For example, the pre-programming voltage supplied to word lines WL0 and WL1 may be a first pre-programming voltage that is lower than a second pre-programming voltage supplied to word lines WLn−2 and WLn−1.

Moreover, in some embodiments, pre-programming voltages may be respectively supplied to some of the word lines WL0 to WLn connected to the NAND string NS, and pre-programming voltages having different voltage levels may be respectively supplied to the some word lines. In this case, a pass voltage may be supplied to the other word lines of the word lines WL0 to WLn.

Figure 13A:
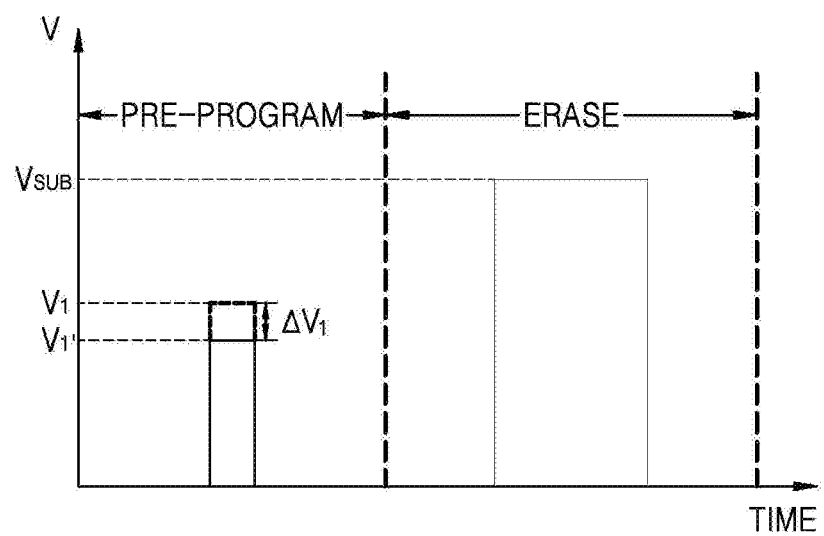
FIGS. 13A and 13B are graphs respectively showing a voltage applied to a bottom memory cell and a voltage applied to an upper memory cell when a pre-program operation and an erase operation according to some embodiments are performed.
Figure 13B:
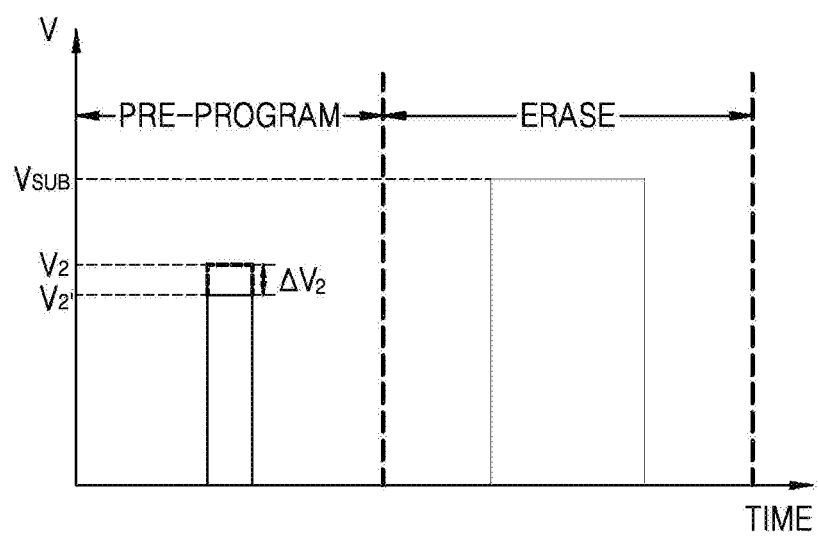

FIGS. 13A and 13B are graphs respectively showing a voltage applied to a lower memory cell and a voltage applied to an upper memory cell when a pre-program operation and an erase operation according to some embodiments are performed. In detail, FIGS. 13A and 13B show a change in a voltage applied to a lower memory cell and a change applied to an upper memory cell when the pre-program operation is performed, based on program/erase cycle count. Here, the program/erase cycle count denotes the number of program/erase cycles. Hereinafter, the pre-program operation based on program/erase cycle count will be described in detail with reference to FIGS. 4, 13A and 13B.

In FIG. 13A, the abscissa axis indicates a time, and the ordinate axis denotes a voltage. For example, a lower memory cell may be a first memory cell connected to a first word line relatively close to the substrate. In a pre-program period, when the program/erase cycle count is less than a threshold value, a first pre-programming voltage $V_1$ may be supplied to the first word line, and when the program/erase cycle count is equal to or greater than the threshold value, a first modification pre-programming voltage $V_1'$ may be supplied to the first word line. In this case, the first modification pre-programming voltage V may have a voltage level that is reduced by a first change amount "$\Delta V_1$" in comparison with the first pre-programming voltage $V_1$.

In FIG. 13B, the abscissa axis indicates a time, and the ordinate axis denotes a voltage. For example, an upper memory cell may be a second memory cell connected to a second word line farther away from the substrate than the lower memory cell. In the pre-program period, when the program/erase cycle count is less than the threshold value, a second pre-programming voltage $V_2$ may be supplied to the second word line, and when the program/erase cycle count is equal to or greater than the threshold value, a second modification pre-programming voltage $V_2'$ may be supplied to the second word line. In this case, the second modification pre-programming voltage $V_2'$ may have a voltage level that is reduced by a second change amount "$\Delta V_2$" in comparison with the second pre-programming voltage $V_2$. In this embodiment, the second change amount "$\Delta V_2$" may be smaller than the first change amount "$\Delta V_1$".

As the program/erase cycle count increases, a program speed for each of memory cells become far faster, and thus, deterioration speeds of memory cells where a diameter of a channel hole is small become far faster. According to this embodiment, when the program/erase cycle count is equal to or greater than the threshold value, the pre-program controller 121 may generate the pre-programming control signal for reducing a voltage level of a pre-programming voltage. In this case, the pre-program controller 121 may perform control so that the first change amount "$\Delta V_1$" of the first pre-programming voltage supplied to lower word lines connected to lower memory cells where a diameter of a channel hole is smaller is larger than the second change amount "$\Delta V_2$" of the second pre-programming voltage supplied to upper word lines. Accordingly, a difference in an operating characteristic of memory cells caused by a difference between the geometric shapes of the memory cells is compensated, and thus, additional deterioration of a lower memory cell is reduced if not prevented.

Figure 14A:
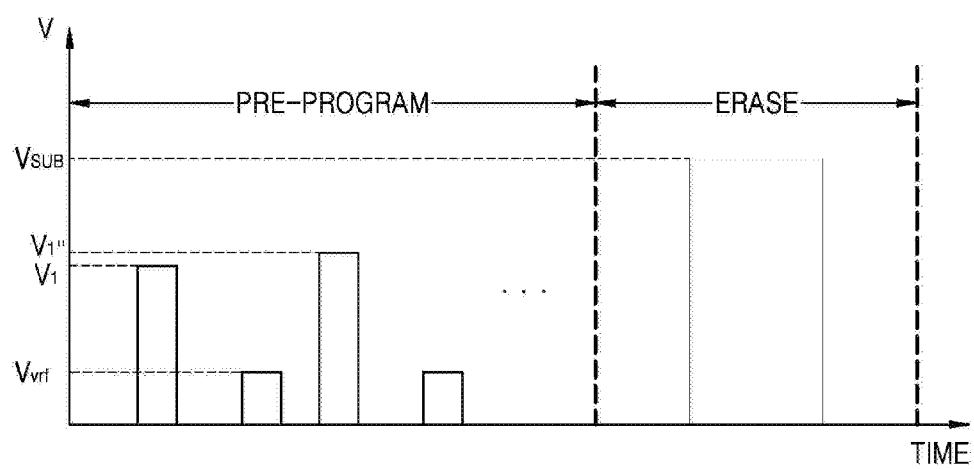
FIGS. 14A and 14B are graphs respectively showing a voltage applied to a lower memory cell and a voltage applied to an upper memory cell when a pre-program operation and an erase operation according to some embodiments are performed.
Figure 14B:
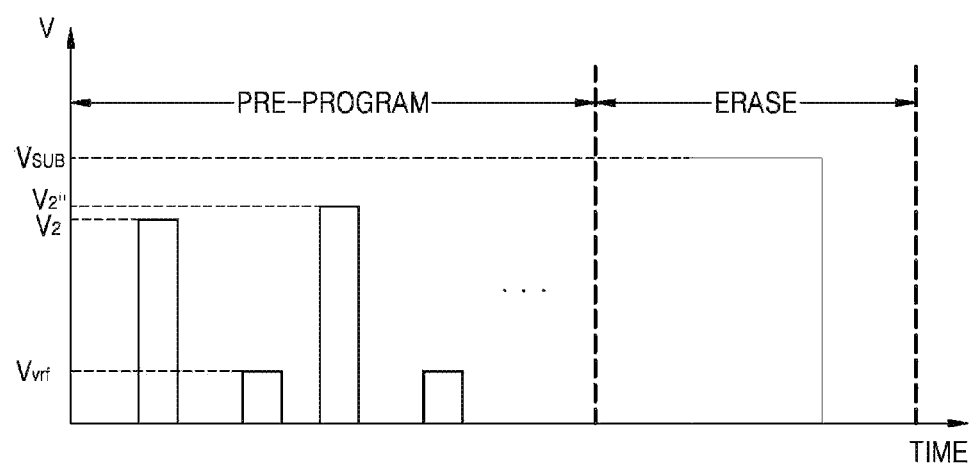

FIGS. 14A and 14B are graphs respectively showing a voltage applied to a lower memory cell and a voltage applied to an upper memory cell when a pre-program operation and an erase operation according to some embodiments are performed. Referring to FIG. 14A, the abscissa axis indicates a time, and the ordinate axis denotes a voltage. For example, a lower memory cell may be a first memory cell connected to a first word line relatively close to the substrate. In a pre-program period, multiple pre-program loops may be executed, and as the number of the pre-program loops increases, a voltage level of a pre-programming voltage may incrementally increase. In other words, a pre-program operation may be performed in an incremental step pulse program (ISPP) scheme.

For example, in a first pre-program loop, a first pre-programming voltage $V_1$ may be supplied to a first word line, and then, a verification voltage $V_{vrf}$ may be supplied to the first word line. When the pre-program operation succeeds as a result of the verification, an erase operation may be performed, and when the pre-program operation fails, a second pre-program loop may be executed. However, other embodiments are not limited thereto, and the verification operation may not be performed in the first pre-program loop.

In the second pre-program loop, a first modified pre-programming voltage $V_1"$ may be supplied to the first word line, and then, the verification voltage $V_{vrf}$ may be supplied to the first word line. In this case, the first modified pre-programming voltage $V_1"$ may have a voltage level that is greater than the first pre-programming voltage $V_1$. When the pre-program operation succeeds as a result of the verification, the erase operation may be performed, and when the pre-program operation fails, a third pre-program loop may be executed. However, other embodiments are not limited thereto, and the verification operation may not be performed in the second pre-program loop. In addition, although three pre-program loops have been used as examples, in other embodiments any number of pre-program loops may be performed.

Referring to FIG. 14B, the abscissa axis indicates a time, and the ordinate axis denotes a voltage. For example, an upper memory cell may be a second memory cell connected to a second word line relatively far away from the substrate. The details described above with reference to FIG. 14A may be applied to this embodiment, and repetitive descriptions are not repeated.

A second pre-programming voltage $V_2$ may be supplied to the second word line in the first pre-program loop, and in the second pre-program loop, a second modified pre-programming voltage $V_2"$ may be supplied to the second word line. In this case, the second modified pre-programming voltage $V_2"$ may have a voltage level that is greater than the second pre-programming voltage $V_2$.

Figure 15:
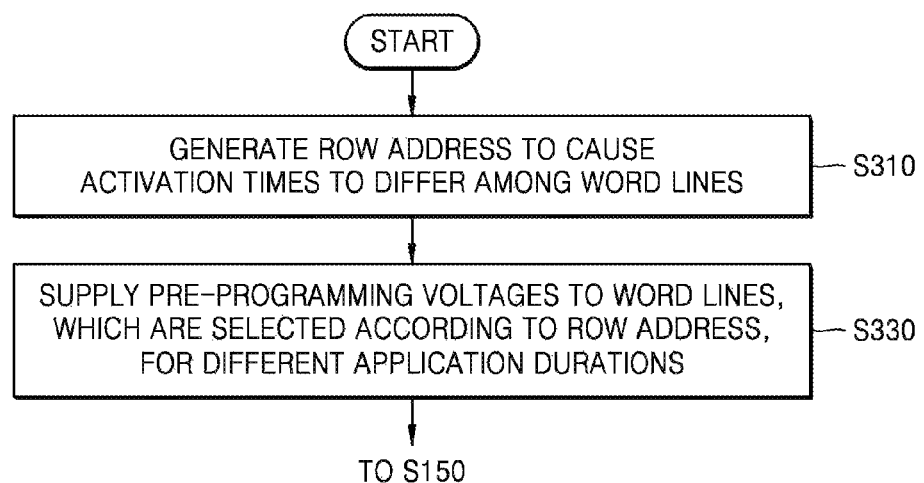
FIG. 15 is a flowchart illustrating a pre-program operation method of a memory device according to some embodiments.

FIG. 15 is a flowchart illustrating a pre-program operation method of a memory device according to some embodiments. Referring to FIG. 15, the pre-program operation method according to this embodiment is a detailed example of operations S110 and S130 of FIG. 9. The details described above with reference to FIG. 9 may be applied to the present embodiment, and repetitive descriptions are not repeated.

In operation S310, the pre-program operation method may generate a row address with activation times that differ among the word lines. For example, the pre-program controller 121 may generate the row address to cause a first application duration of a first pre-programming voltage supplied to a first word line adjacent to the substrate to be shorter than a second application duration of a second pre-programming voltage supplied to a second word line disposed over the first word line.

However, other embodiments are not limited thereto. In other embodiments, when a memory cell array includes multiple memory blocks which are vertically arranged, an application duration of a pre-programming voltage supplied to a lower word line of an upper block may be shorter than that of a pre-programming voltage supplied to an upper word line of a bottom block. This will be described below with reference to FIGS. 24 and 25.

In operation S330, the pre-program operation method may respectively supply pre-programming voltages to word lines, which are selected according to the row address for different application durations. For example, the row decoder 140 may supply a corresponding pre-programming voltage to each of the word lines for a corresponding application duration in response to the row address.

Figure 16A:
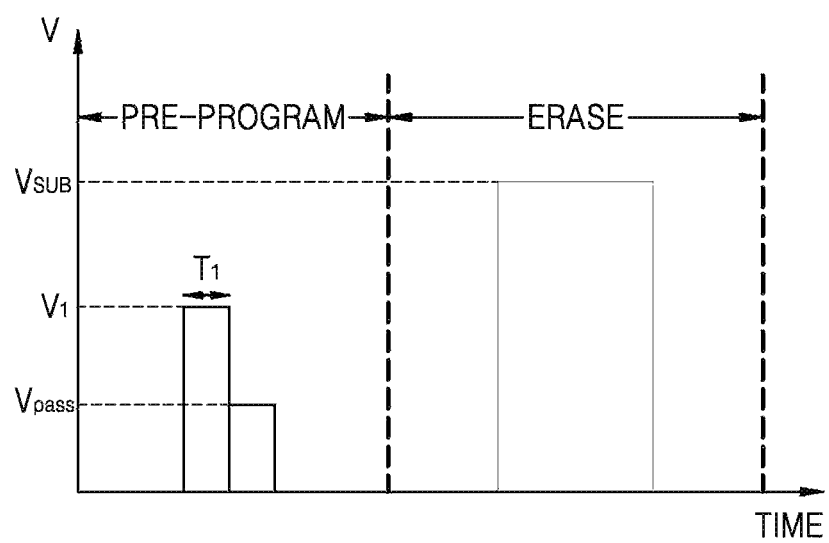
FIGS. 16A and 16B are graphs respectively showing a voltage applied to a lower memory cell and a voltage applied to an upper memory cell when a pre-program operation and an erase operation according to some embodiments are performed.
Figure 16B:
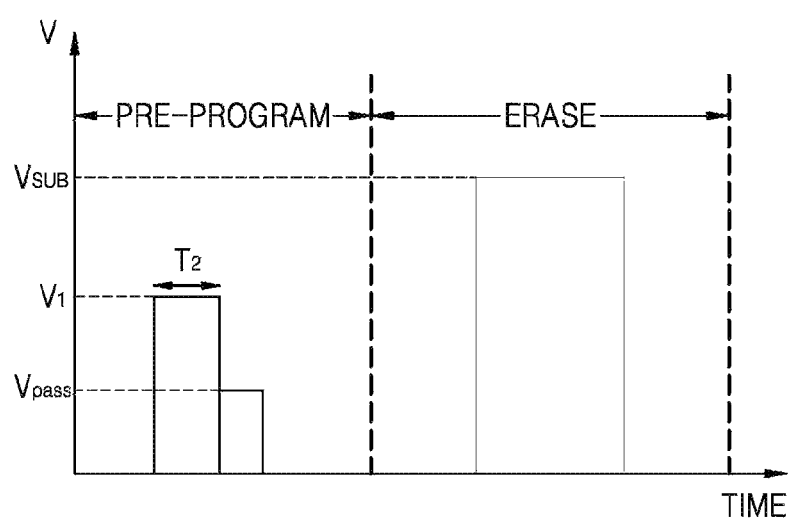

FIGS. 16A and 16B are graphs respectively showing a voltage applied to a lower memory cell and a voltage applied to an upper memory cell when a pre-program operation and an erase operation according to some embodiments are performed. Referring to FIG. 16A, the abscissa axis indicates a time, and the ordinate axis indicates a voltage. For example, a lower memory cell may be a first memory cell connected to a first word line relatively close to the substrate. In a pre-program period, a first pre-programming voltage $V_1$ may be supplied to the first word line for a first application duration $T_1$. In this case, a voltage level of the first pre-programming voltage $V_1$ may be equal to or lower than that of a programming voltage for programming a memory cell to a first program state (for example, P1 of FIG. 2), but other embodiments are not limited thereto. Subsequently, a pass voltage $V_{pass}$ lower than the first pre-programming voltage $V_1$ may be supplied to the first word line, and subsequently, a pre-program verification voltage may be supplied to the first word line.

In an erase period, an erase voltage $V_{SUB}$ may be supplied to the substrate. A voltage level of the erase voltage $V_{SUB}$ may be higher than that of the first pre-programming voltage $V_1$, and an application duration of the erase voltage $V_{SUB}$ may be longer than the application duration $T_1$ of the first pre-programming voltage $V_1$. Subsequently, although not shown, an erase verification voltage may be supplied to the first word line.

Referring to FIG. 16B, the abscissa axis indicates a time, and the ordinate axis indicates a voltage. An upper memory cell may be a second memory cell connected to a second word line farther away from the substrate. The second word line may be disposed over the first word line, and in an embodiment, another word line may not be disposed between the first word line and the second word line. In other embodiments, other word lines may be disposed between the first word line and the second word line.

In the pre-program period, the first pre-programming voltage $V_1$ may be supplied to the second word line for a second application duration $T_2$. In this case, the second application duration $T_2$ may be longer than the first application duration $T_1$. Therefore, even when a diameter of a channel hole of the second memory cell is greater than that of a channel hole of the first memory cell or a thickness of a tunneling insulation layer of the second memory cell is thicker than that of a tunneling insulation layer of the first memory cell, an electric field stress applied to the first memory cell may be substantially the same as an electric field stress applied to the second memory cell because the second application duration $T_2$ is longer than the first application duration $T_1$. Accordingly, a difference in an operating characteristic of memory cells caused by a difference between the geometric shapes of the memory cells is compensated, and additional deterioration of a bottom memory cell is reduced or prevented. Also, as a result of the pre-program operation, each of the memory cells has a threshold voltage corresponding to the substantially same program state irrespective of a level.

Figure 17:
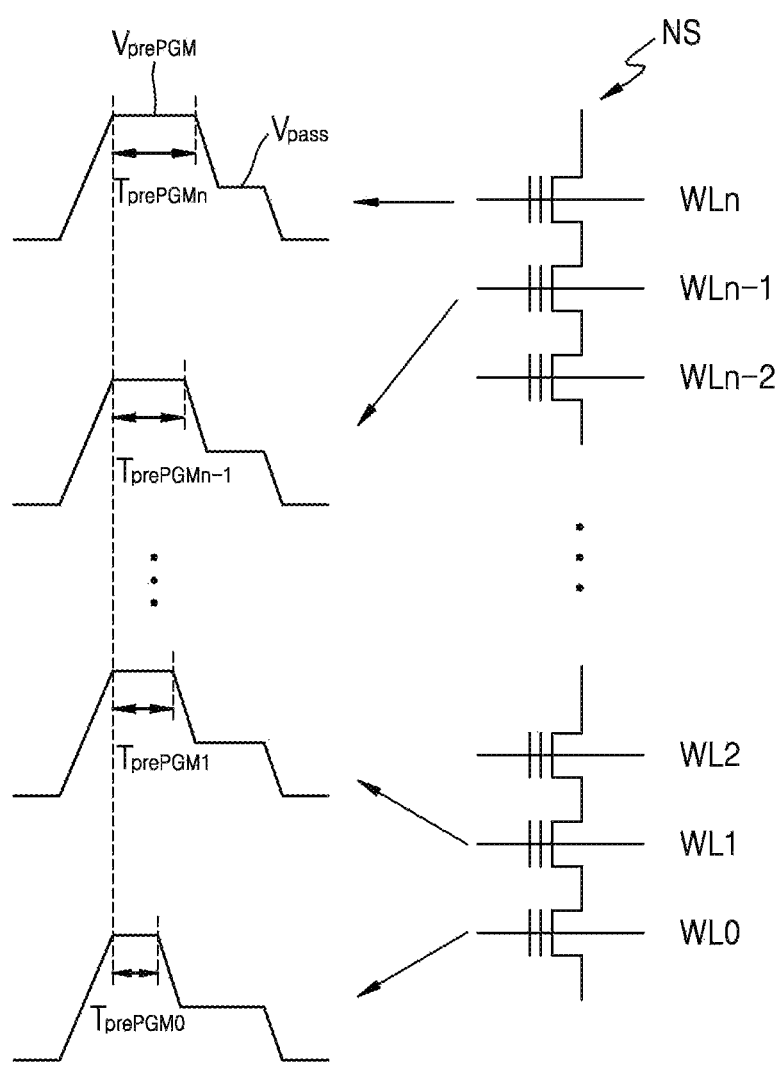
FIG. 17 shows pre-programming voltages respectively applied to multiple word lines connected to a NAND string according to some embodiments.

FIG. 17 shows pre-programming voltages respectively applied to multiple word lines connected to a NAND string NS according to some embodiments. Referring to FIG. 17, the NAND string NS may include multiple memory cells respectively connected to multiple word lines WL0 to WLn. Although not shown, the NAND string NS may further include a ground selection line and multiple selection transistors connected to the string selection line.

A pre-programming voltage $V_{prePGM}$ may be supplied to a first word line WL0, which is a lower word line closer to the substrate, among the word lines WL0 to WLn for a first application duration $T_{prePGM0}$ and, a pre-programming voltage $V_{prePGM}$ may be supplied to a second word line WL1 above the first word line WL0 for a second application duration $T_{prePGM1}$ longer than the first application duration $T_{prePGM0}$. In this case, a voltage level of the pre-programming voltage $V_{prePGM}$ supplied to the first word line WL0 may be the same as that of the pre-programming voltage $V_{prePGM}$ supplied to the second word line WL1.

In this embodiment, an application start time of the pre-programming voltage $V_{prePGM}$ supplied to the first word line WL0 may be the same as that of the pre-programming voltage $V_{prePGM}$ supplied to the second word line WL1. Since the first application duration $T_{prePGM0}$ is shorter than the second application duration $T_{prePGM1}$, an application end time of the pre-programming voltage $V_{prePGM}$ supplied to the first word line WL0 may be earlier than that of the pre-programming voltage $V_{prePGM}$ supplied to the second word line WL1. In this case, if 0 V is immediately applied to the first word line WL0, channel voltage disequilibrium between a corresponding memory cell and a memory cell adjacent thereto occurs, and for this reason, hot carrier injection (HCI) occurs. Therefore, in this embodiment, after application of the pre-programming voltage $V_{prePGM}$ ends, a pass voltage $V_{pass}$ may be applied to the first word line WL0. Likewise, after application of the pre-programming voltage $V_{prePGM}$ ends, the pass voltage $V_{pass}$ may also be applied to the second word line WL1.

Moreover, a pre-programming voltage $V_{prePGM}$ may be supplied to an (n-1)st word line WLn-1, which is an upper word line farther away from the substrate, for an (n-1)st application duration $T_{prePGMn-1}$ longer than the second application duration $T_{prePGM1}$ and, a pre-programming voltage $V_{prePGM}$ may be supplied to an nth word line WLn above the (n-1)st word line WLn-1 for an nth application duration $T_{prePGMn}$ longer than the (n-1)st application duration $T_{prePGMn-1}$. In this case, a voltage level of the pre-programming voltage $V_{prePGM}$ supplied to the (n-1)st word line WLn-1 may be the same as that of the pre-programming voltage $V_{prePGM}$ supplied to the nth word line WLn.

In this embodiment, an application start time of the pre-programming voltage $V_{prePGM}$ supplied to the (n-1)st word line WLn-1 may be the same as that of the pre-programming voltage $V_{prePGM}$ supplied to the nth word line WLn. Since the (n-1)st application duration $T_{prePGMn-1}$ is shorter than the nth application duration $T_{prePGMn}$, an application end time of the pre-programming voltage $V_{prePGM}$ supplied to the (n-1)st word line WLn-1 may be earlier than that of the pre-programming voltage $V_{prePGM}$ supplied to the nth word line WLn. In this case, if 0 V is immediately applied to the (n-1)st word line WLn-1, channel voltage disequilibrium between a corresponding memory cell and a memory cell adjacent thereto occurs, and for this reason, HCI occurs. Therefore, in this embodiment, after application of the pre-programming voltage $V_{prePGM}$ ends, the pass voltage $V_{pass}$ may be applied to the (n-1)st word line WLn-1. Likewise, after application of the pre-programming voltage $V_{prePGM}$ ends, the pass voltage $V_{pass}$ may also be applied to the nth word line WLn.

In this embodiment, application durations of the pre-programming voltages $V_{prePGM}$ respectively supplied to the word lines WL0 to WLn connected to the NAND string NS may differ. In this case, voltage levels of the pre-programming voltages $V_{prePGM}$ respectively supplied to the word lines WL0 to WLn may be the same.

However, other embodiments are not limited thereto. In other embodiments, the word lines WL0 to WLn connected to the NAND string NS may be grouped into multiple groups. In this case, the same application duration of pre-programming voltages $V_{prePGM}$ may be supplied to word lines of a group while the application durations of pre-programming voltages $V_{prePGM}$ of each group are different. For example, the application duration of the pre-programming voltage supplied to word lines WL0 and WL1 may be a first duration that is lower than a second duration of the pre-programming voltage supplied to word lines WLn-2 and WLn-1.

Moreover, in some embodiments, pre-programming voltages $V_{prePGM}$ may be respectively supplied to some of the word lines WL0 to WLn connected to the NAND string NS, and pre-programming voltages $V_{prePGM}$ having different application durations may be respectively supplied to the some word lines. In this case, the pass voltage $V_{pass}$ may be supplied to the other word lines of the word lines WL0 to WLn.

Figure 18:
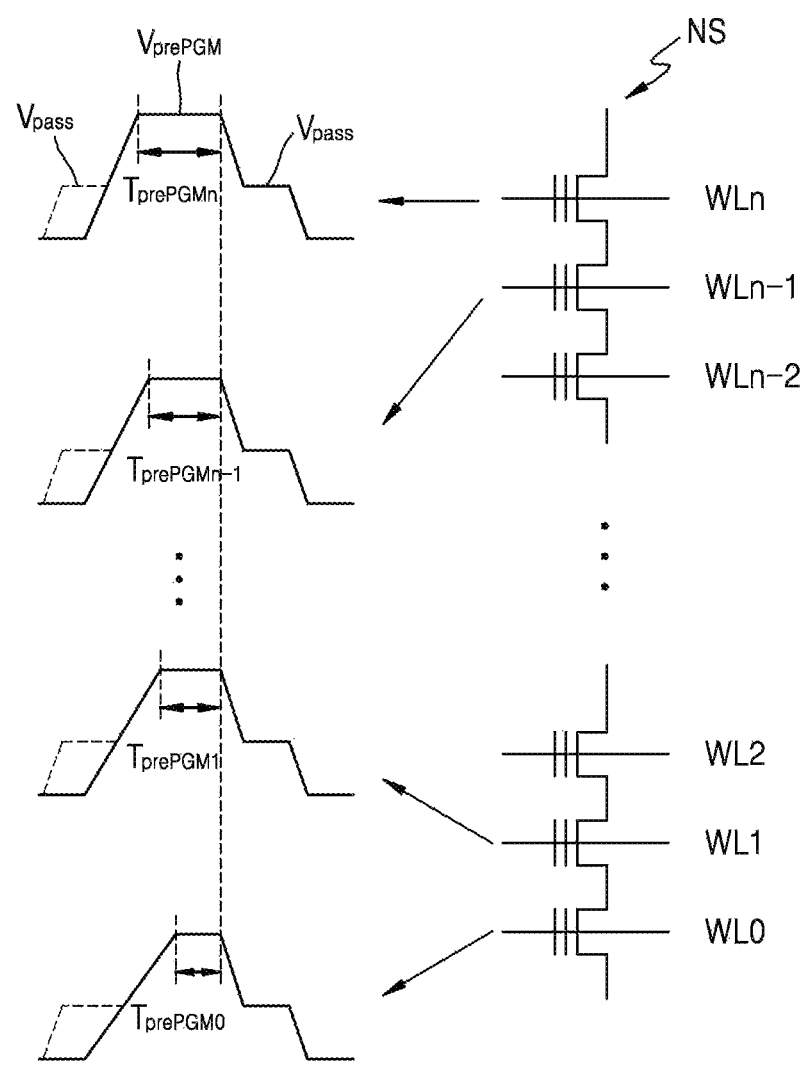
FIG. 18 shows pre-programming voltages respectively applied to multiple word lines connected to a NAND string according to some embodiments.

FIG. 18 shows pre-programming voltages respectively applied to multiple word lines connected to a NAND string NS according to some embodiments. Referring to FIG. 18, this embodiment is a modification of the embodiment of FIG. 17, and the details described above with reference to FIG. 17 may be applied to this embodiment, and thus, repetitive descriptions are not repeated. In the embodiment of FIG. 17, application start times of pre-programming voltages $V_{prePGM}$ respectively supplied to word lines are the same, but in this embodiment, application end times of pre-programming voltages $V_{prePGM}$ respectively supplied to word lines are the same.

For example, a pre-programming voltage $V_{prePGM}$ may be supplied to a first word line WL0 for a first application duration $T_{prePGM0}$, and a pre-programming voltage $V_{prePGM}$ may be supplied to a second word line WL1 above the first word line WL0 for a second application duration $T_{prePGM1}$ longer than the first application duration $T_{prePGM0}$. Also, a pre-programming voltage $V_{prePGM}$ may be supplied to an (n-1)st word line WLn-1 for an n-1st application duration $T_{prePGMn-1}$ longer than the second application duration $T_{prePGM1}$, and a pre-programming voltage $V_{prePGM}$ may be supplied to an nth word line WLn above the (n-1)st word line WLn-1 for an nth application duration $T_{prePGMn}$ longer than the (n-1)st application duration $T_{prePGMn-1}$. In this case, voltage levels of the pre-programming voltages $V_{prePGM}$ respectively supplied to the word lines WL0, WL1, WLn-1 and WLn may be the same.

In this embodiment, application end times of the pre-programming voltages $V_{prePGM}$ respectively supplied to the word lines WL0, WL1, WLn-1 and WLn may be the same. Since the first application duration $T_{prePGM0}$ is shorter than the second application duration $T_{prePGM1}$, an application start time of the pre-programming voltage $V_{prePGM}$ supplied to the first word line WL0 may be later than that of the pre-programming voltage $V_{prePGM}$ supplied to the second word line WL1. Also, since the (n-1)st application duration $T_{prePGMn-1}$ is shorter than the nth application duration $T_{prePGMn}$, an application start time of the pre-programming voltage $V_{prePGM}$ supplied to the (n-1)st word line WLn-1 may be later than that of the pre-programming voltage $V_{prePGM}$ supplied to the nth word line WLn.

In some embodiments, after application of the pre-programming voltage $V_{prePGM}$ ends, a pass voltage $V_{pass}$ may also be applied to the word lines WL0, WL1, WLn−1 and WLn. In some embodiments, the pass voltage $V_{pass}$ may be applied to the WL0, WL1, WLn−1 and WLn before applying the pre-programming voltage $V_{prePGM}$. The application of such a pass voltage is illustrated by the dashed lines preceding the pre-programming voltage $V_{prePGM}$ pulse. As a result, a voltage difference between adjacent memory cells may be reduced.

Figure 19A:
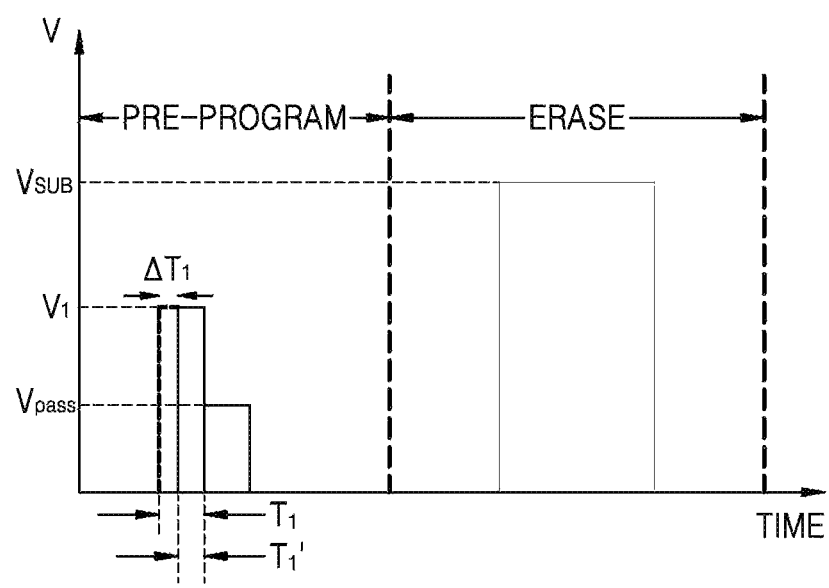
FIGS. 19A and 19B are graphs respectively showing a voltage applied to a lower memory cell and a voltage applied to an upper memory cell when a pre-program operation and an erase operation according to some embodiments are performed.
Figure 19B:
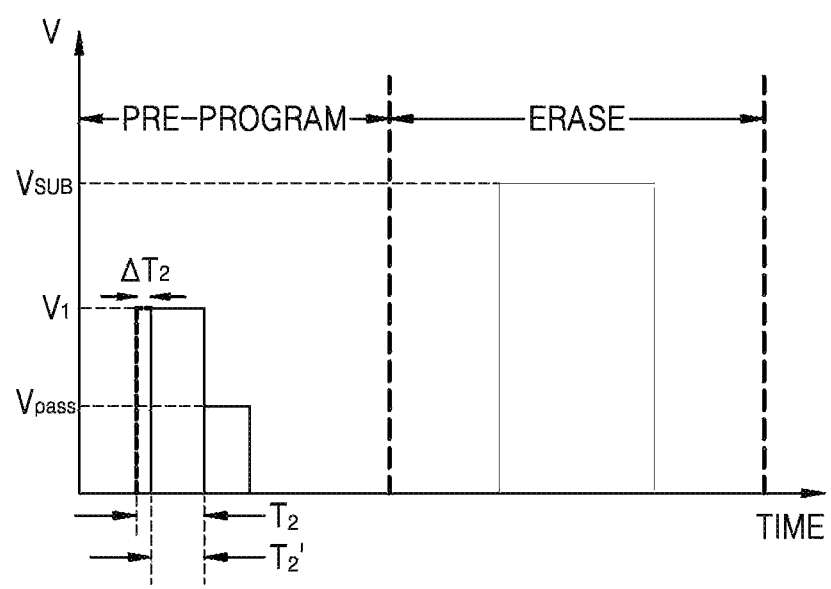

FIGS. 19A and 19B are graphs respectively showing a voltage applied to a lower memory cell and a voltage applied to an upper memory cell when a pre-program operation and an erase operation according to some embodiments are performed. For example, FIGS. 19A and 19B show a change in a voltage applied to a lower memory cell and a change applied to an upper memory cell when the pre-program operation is performed, based on program/erase cycle count. Hereinafter, the pre-program operation based on program/erase cycle count will be described in detail with reference to FIGS. 4, 19A and 19B.

In FIG. 19A, the abscissa axis indicates a time, and the ordinate axis denotes a voltage. For example, a lower memory cell may be a first memory cell connected to a first word line closer to the substrate than an upper memory cell. In a pre-program period, when the program/erase cycle count is less than a threshold value, a first pre-programming voltage $V_1$ may be supplied to the first word line for a first application duration $T_1$, and when the program/erase cycle count is equal to or greater than the threshold value, the first pre-programming voltage $V_1$ may be supplied to the first word line for a first modified application duration $T_1'$. In this case, the first modified application duration $T_1'$ may be a time which is reduced by a first change amount "$\Delta T_1$" in comparison with the first application duration $T_1$.

In FIG. 19B, the abscissa axis indicates a time, and the ordinate axis denotes a voltage. For example, an upper memory cell may be a second memory cell connected to a second word line farther away from the substrate than the lower memory cell. In the pre-program period, when the program/erase cycle count is less than the threshold value, the first pre-programming voltage $V_1$ may be supplied to the second word line for a second application duration $T_2$, and when the program/erase cycle count is equal to or greater than the threshold value, the first pre-programming voltage $V_1$ may be supplied to the second word line for a second modified application duration $T_2'$. In this case, the second modified application duration $T_2'$ may be a time which is reduced by a second change amount "$\Delta T_2$" in comparison with the second application duration $T_2$. In this embodiment, the second change amount "$\Delta T_2$" may be smaller than the first change amount "$\Delta T_1$".

As the program/erase cycle count increases, a program speed for each of memory cells become far faster, and thus, deterioration speeds of memory cells where a diameter of a channel hole is small become far faster. According to this embodiment, when the program/erase cycle count is equal to or greater than the threshold value, the pre-program controller 121 may generate the pre-programming control signal for shortening an application duration of a pre-programming voltage. In this case, the pre-program controller 121 may perform control so that the first change amount "$\Delta T_1$" of the first pre-programming voltage supplied to lower word lines, connected to lower memory cells where a diameter of a channel hole is small, is larger than the second change amount "$\Delta T_2$" of the second pre-programming voltage supplied to upper word lines. Accordingly, a difference in an operating characteristic of memory cells caused by a difference between the geometric shapes of the memory cells is compensated, and thus, additional deterioration of a lower memory cell is reduced or prevented.

Figure 20A:
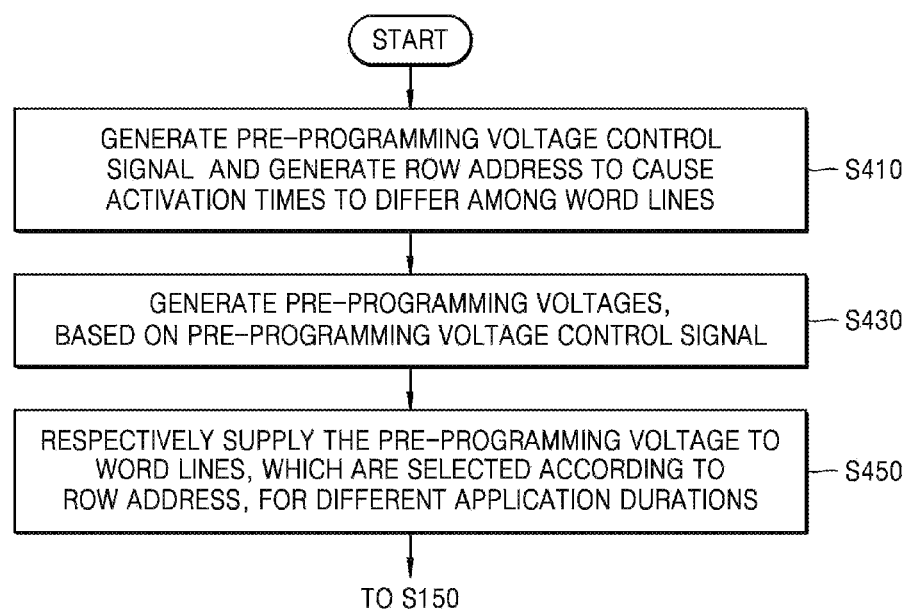
FIGS. 20A and 20B are flowcharts illustrating pre-program operation methods of a memory device according to some embodiments.
Figure 20B:
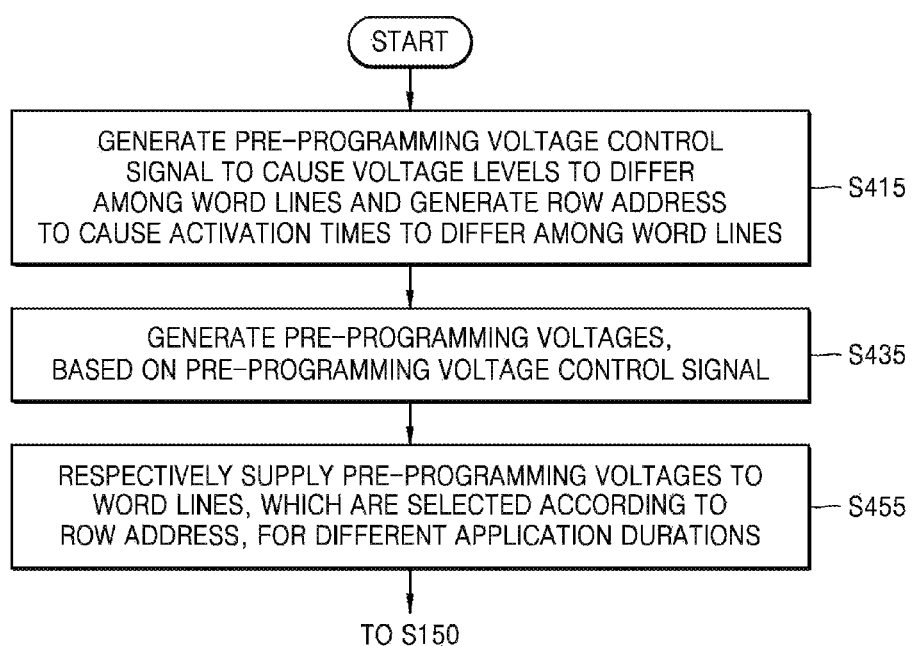

FIGS. 20A and 20B are flowcharts illustrating pre-program operation methods of a memory device according to some embodiments. Referring to FIG. 20A, the pre-program operation method according to this embodiment is a detailed example of operations S110 and S130 of FIG. 9. The details described above with reference to FIG. 9 may be applied to this embodiment, and repetitive descriptions are not repeated.

In operation S410, a pre-programming voltage control signal is generated to cause voltage levels to be a pre-programming voltage and generate a row address with differing activation times. For example, the pre-program controller 121 may generate the pre-programming control signal to cause a voltage level of a pre-programming voltage applied to the word lines to be a single pre-programming voltage. In addition, the pre-program controller 121 may generate a row address to cause a first application duration of the first pre-programming voltage, supplied to the first word line adjacent to the substrate, to be shorter than a second application duration of the second pre-programming voltage supplied to the second word line disposed over the first word line.

In operation S430, a pre-programming voltage is generated based on the pre-programming voltage control signal. For example, the voltage generator 130 may generate the pre-programming voltages having the same voltage levels in response to the pre-programming voltage control signal.

In operation S450, the pre-programming voltage is supplied to word lines, which are selected according to the row address, for different application durations. For example, the row decoder 140 may supply the pre-programming voltage to each of the word lines for a corresponding application duration in response to the row address.

Referring to FIG. 20B, in this embodiment, both the pre-programming voltage and the activation time may differ among the word lines. The operation may be similar to that of FIG. 20A and repetitive descriptions may be omitted. In this embodiment, in operation S415, a pre-programming voltage control signal is generated for generating multiple pre-programming voltages and differing activation times of a row address are generated. In operation S435, the multiple pre-programming voltages are generated based on the pre-programming voltage control signal. In operation S455, the various pre-programming voltages are supplied for the corresponding different activation times according to the particular word line or group of word lines.

Figure 21A:
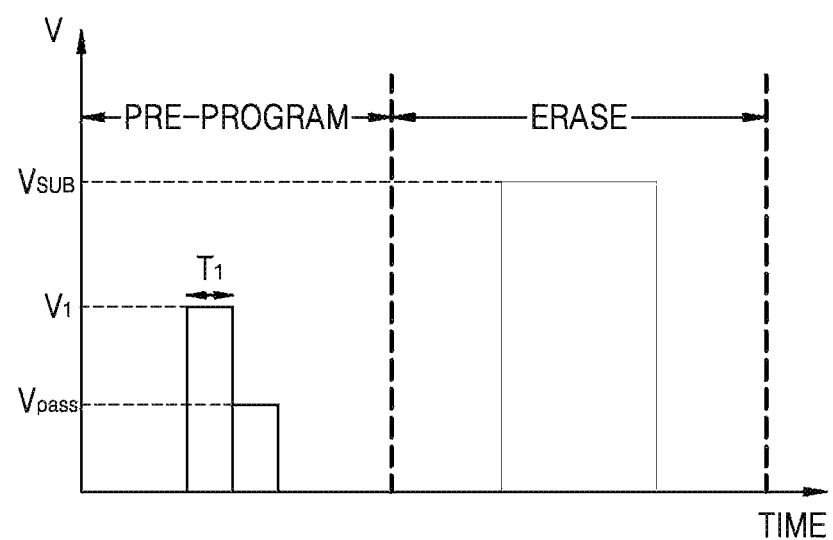
FIGS. 21A and 21B are graphs respectively showing a voltage applied to a lower memory cell and a voltage applied to an upper memory cell when a pre-program operation and an erase operation according to some embodiments are performed.
Figure 21B:
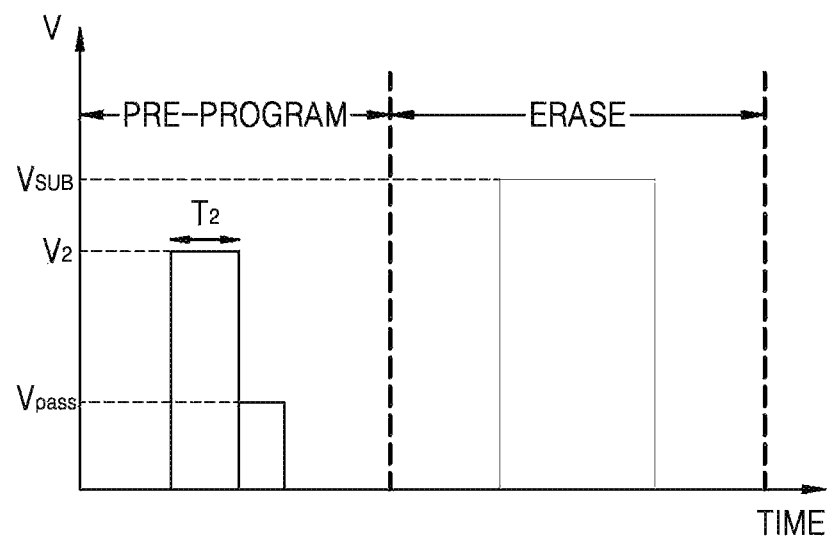

FIGS. 21A and 21B are graphs respectively showing a voltage applied to a lower memory cell and a voltage applied to an upper memory cell when a pre-program operation and an erase operation according to some embodiments are performed. Referring to FIG. 21A, the abscissa axis indicates a time, and the ordinate axis indicates a voltage. For example, a lower memory cell may be a first memory cell connected to a first word line closer to the substrate than an upper memory cell. In a pre-program period, a first pre-programming voltage $V_1$ may be supplied to the first word line for a first application duration $T_1$. In this case, a voltage level of the first pre-programming voltage $V_1$ may be lower than that of a programming voltage for programming a memory cell to a first program state (for example, P1 of FIG. 2), but other embodiments are not limited thereto. Subsequently, a pass voltage $V_{pass}$ lower than the first pre-programming voltage $V_1$ may be supplied to the first word line. Subsequently, although not shown, a pre-program verification voltage may be supplied to the first word line.

In an erase period, an erase voltage $V_{SUB}$ may be supplied to the substrate. A voltage level of the erase voltage $V_{SUB}$ may be higher than that of the first pre-programming voltage $V_1$, and an application duration of the erase voltage $V_{SUB}$ may be longer than the application duration $T_1$ of the first pre-programming voltage $V_1$. Subsequently, although not shown, an erase verification voltage may be supplied to the first word line.

Referring to FIG. 21B, the abscissa axis indicates a time, and the ordinate axis indicates a voltage. An upper memory cell may be a second memory cell connected to a second word line farther away from the substrate than the lower memory cell. The second word line may be disposed over the first word line, and in an embodiment, another word line may not be disposed between the first word line and the second word line. In other embodiments, other word lines may be disposed between the first word line and the second word line.

In the pre-program period, a second pre-programming voltage $V_2$ may be supplied to the second word line for a second application duration $T_2$. In this case, the second application duration $T_2$ may be longer than the first application duration $T_1$, and a voltage level of the second pre-programming voltage $V_2$ may be higher than that of the first pre-programming voltage $V_1$. Therefore, even when a diameter of a channel hole of the second memory cell is greater than that of a channel hole of the first memory cell or a thickness of a tunneling insulation layer of the second memory cell is thicker than that of a tunneling insulation layer of the first memory cell, an electric field stress applied to the first memory cell may be substantially the same as an electric field stress applied to the second memory cell because the voltage level of the second pre-programming voltage $V_2$ is higher than that of the first pre-programming voltage $V_1$. Accordingly, a difference of an operation characteristic of memory cells caused by a difference between the geometric shapes of the memory cells is compensated, and additional deterioration of a lower memory cell is reduced or prevented. Also, as a result of the pre-program operation, each of the memory cells may have a threshold voltage corresponding to the substantially same program state irrespective of a level.

Figure 22:
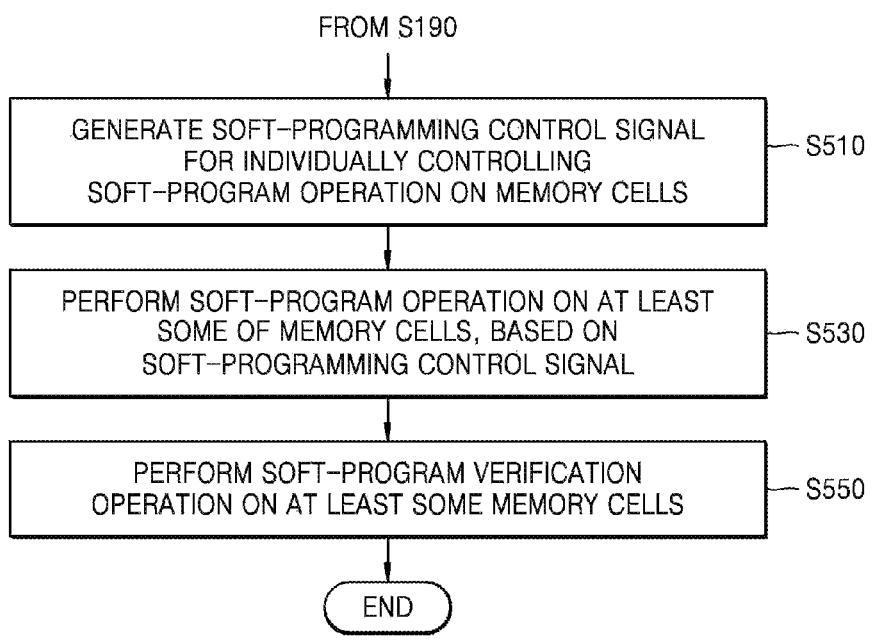
FIG. 22 is a flowchart illustrating a method of operating a memory device according to some embodiments.

FIG. 22 is a flowchart illustrating a method of operating a memory device according to some embodiments. Referring to FIG. 22, the method according to the present embodiment may be a method which is performed after operation S190 of FIG. 9, and for example, may include operations which are sequentially performed in the memory device 100 of FIG. 4. Therefore, the details described above with reference to FIGS. 4 and 9 may be applied to this embodiment, and repetitive descriptions are not repeated.

In operation S510, a soft-programming control signal is generated for individually controlling a soft-program operation on memory cells. Here, the soft-program operation denotes an operation of applying a programming voltage (hereinafter referred to as a soft-programming voltage) to at least some of memory cells, for which an erase operation has been performed, to reduce a distribution width in an erase state. For example, the control logic 120 may individually determine soft-programming voltages supplied to word lines, based on levels of the word lines, thereby generating the soft-programming control signal. The control logic 120 may further include a soft-program controller, and operation S510 may be performed by the soft-program controller.

According to this embodiment, the method may perform the erase operation and then may further perform a soft-program operation, and thus, over-erasure is prevented, and a distribution width of a memory cell distribution corresponding to the erase state (for example, E of FIG. 2) is further narrowed. In some embodiments, when a soft-program command is received from the memory controller 200, the control logic 120 may generate the soft-programming control signal. In some embodiments, when an erase command is received from the memory controller 200, the control logic 120 may generate an erase control signal and then may generate the soft-programming control signal.

In operation S530, the soft-program operation is performed on at least some of the memory cells, based on the soft-programming control signal. In some embodiments, the soft-programming control signal may include a voltage control signal which has different voltage levels by word lines, and the voltage generator 130 may generate soft-programming voltages having different voltage levels according to the voltage control signal. In some embodiments, the soft-programming control signal may include a row address which has different activation times among the word lines, and the row decoder 140 may respectively supply the soft-programming voltages to corresponding word lines for different application durations according to the row address.

In operation S550, a soft-program verification operation is performed on the at least some memory cells. In detail, the soft-program verification operation may be performed by applying the soft-program verification voltage to the word lines. When threshold voltages of the memory cells are lower than a reference voltage as a result of the verification, operation S550 may be performed, and otherwise, the method may end. However, other embodiments are not limited thereto. In other embodiments, operation S550 may be omitted.

Figure 23A:
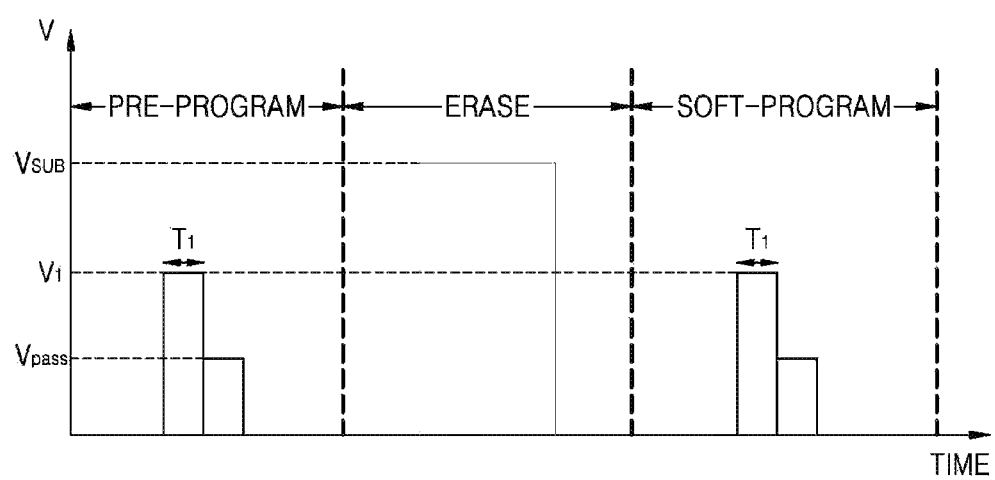
FIGS. 23A to 23D are graphs respectively showing a voltage applied to a lower memory cell and a voltage applied to an upper memory cell when a pre-program operation, an erase operation, and a soft-program operation according to some embodiments are performed.
Figure 23B:
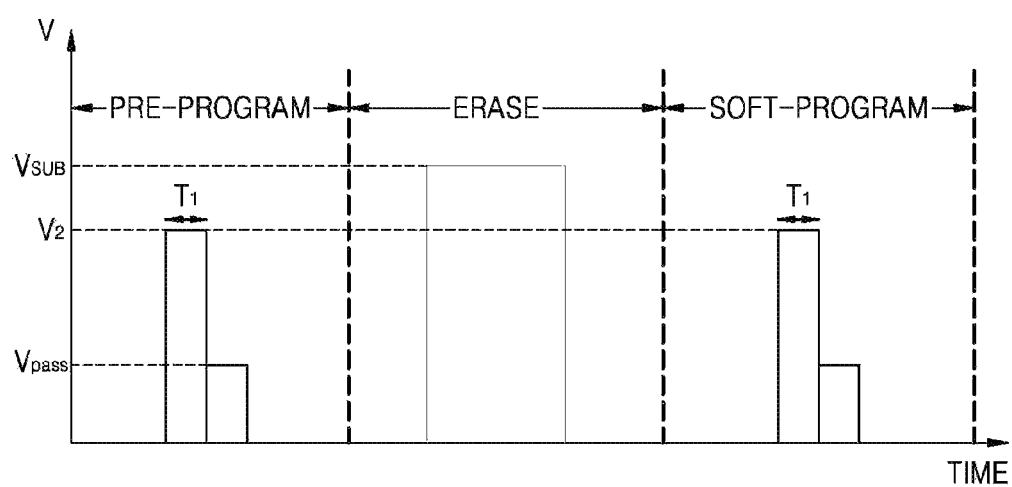
Figure 23C:
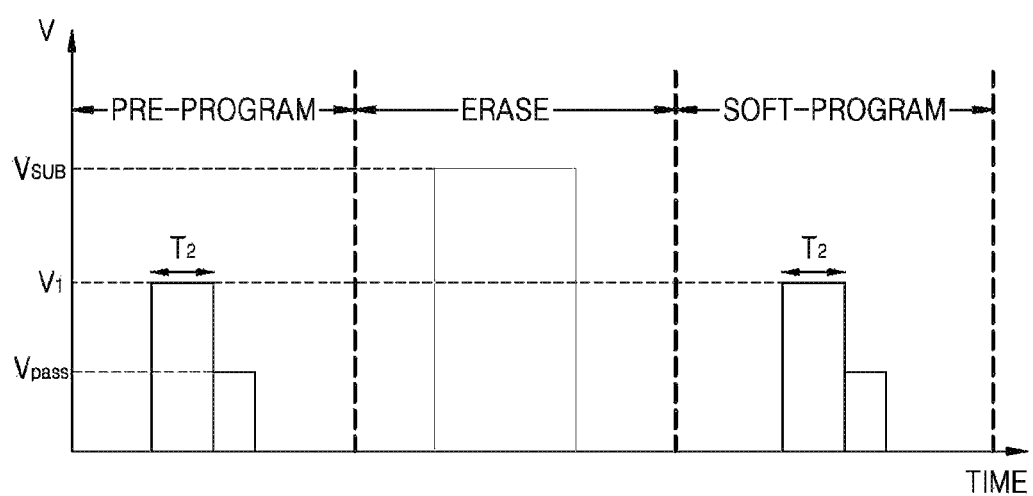
Figure 23D:
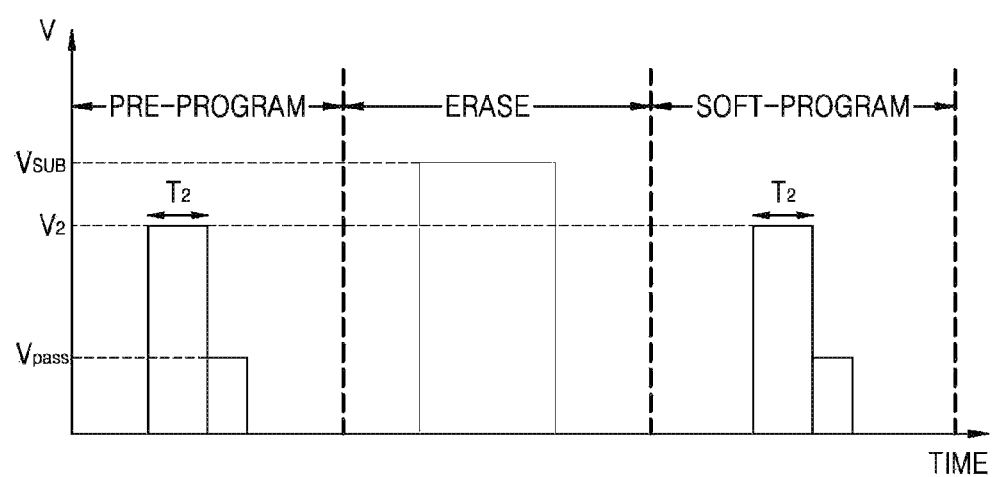

FIGS. 23A to 23D are graphs respectively showing a voltage applied to a lower memory cell and a voltage applied to an upper memory cell when a pre-program operation, an erase operation, and a soft-program operation according to some embodiments are performed. For example, FIG. 23A shows a voltage applied to a lower memory cell according to an embodiment, and FIGS. 23B to 23D show voltages applied to an upper memory cell according to some embodiments. For example, a lower memory cell may be a first memory cell connected to a first word line closer to the substrate than an upper memory cell, and the upper memory cell may be a second memory cell connected to a second word line farther away from the substrate than the lower memory cell.

Referring to FIG. 23A, in a pre-program period, a first pre-programming voltage $V_1$ may be supplied to the first word line for a first application duration $T_1$. Subsequently, in an erase period, an erase voltage $V_{SUB}$ may be supplied to the substrate. Subsequently, in a soft-program period, a first soft-programming voltage $V_1$ may be supplied to the first word line for the first application duration $T_1$. However, other embodiments are not limited thereto. In other embodiments, a voltage level or an application duration of a soft-programming voltage which is applied to the first word line in the soft-program period may differ from a voltage level or an application duration of a pre-programming voltage which is applied to the first word line in the pre-program period.

Referring to FIG. 23B, in the pre-program period, a second pre-programming voltage $V_2$ may be supplied to the second word line for a first application duration $T_1$. In this case, a voltage level of the second pre-programming voltage $V_2$ may be higher than that of the first pre-programming voltage $V_1$. Subsequently, in the erase period, the erase voltage $V_{SUB}$ may be supplied to the substrate. Subsequently, in the soft-program period, a second soft-programming voltage $V_2$ may be supplied to the second word line for the first application duration $T_1$. However, other embodiments are not limited thereto. In other embodiments, a voltage level or an application duration of a soft-programming voltage which is applied to the second word line in the soft-program period may differ from the voltage level or application duration of the pre-programming voltage which is applied to the first word line in the pre-program period.

Referring to FIG. 23C, in the pre-program period, the first pre-programming voltage $V_1$ may be supplied to the second word line for the second application duration $T_2$. In this case, the second application duration $T_2$ may be longer than the first application duration $T_1$. Subsequently, in the erase period, the erase voltage $V_{SUB}$ may be supplied to the substrate. Subsequently, in the soft-program period, the first soft-programming voltage $V_1$ may be supplied to the second word line for the second application duration $T_2$. However, other embodiments are not limited thereto. In other embodiments, a voltage level or an application duration of a soft-programming voltage which is applied to the second word line in the soft-program period may differ from the voltage level or application duration of the pre-programming voltage which is applied to the first word line in the pre-program period.

Referring to FIG. 23D, in the pre-program period, the second pre-programming voltage $V_2$ may be supplied to the second word line for the second application duration $T_2$. In this case, the second application duration $T_2$ may be longer than the first application duration $T_1$, and a voltage level of the second pre-programming voltage $V_2$ may be higher than that of the first pre-programming voltage $V_1$. Subsequently, in the erase period, the erase voltage $V_{SUB}$ may be supplied to the substrate. Subsequently, in the soft-program period, the second soft-programming voltage $V_2$ may be supplied to the second word line for the second application duration $T_2$. However, other embodiments are not limited thereto. In other embodiments, the voltage level or application duration of the soft-programming voltage which is applied to the second word line in the soft-program period may differ from the voltage level or application duration of the pre-programming voltage which is applied to the first word line in the pre-program period.

Figure 24:
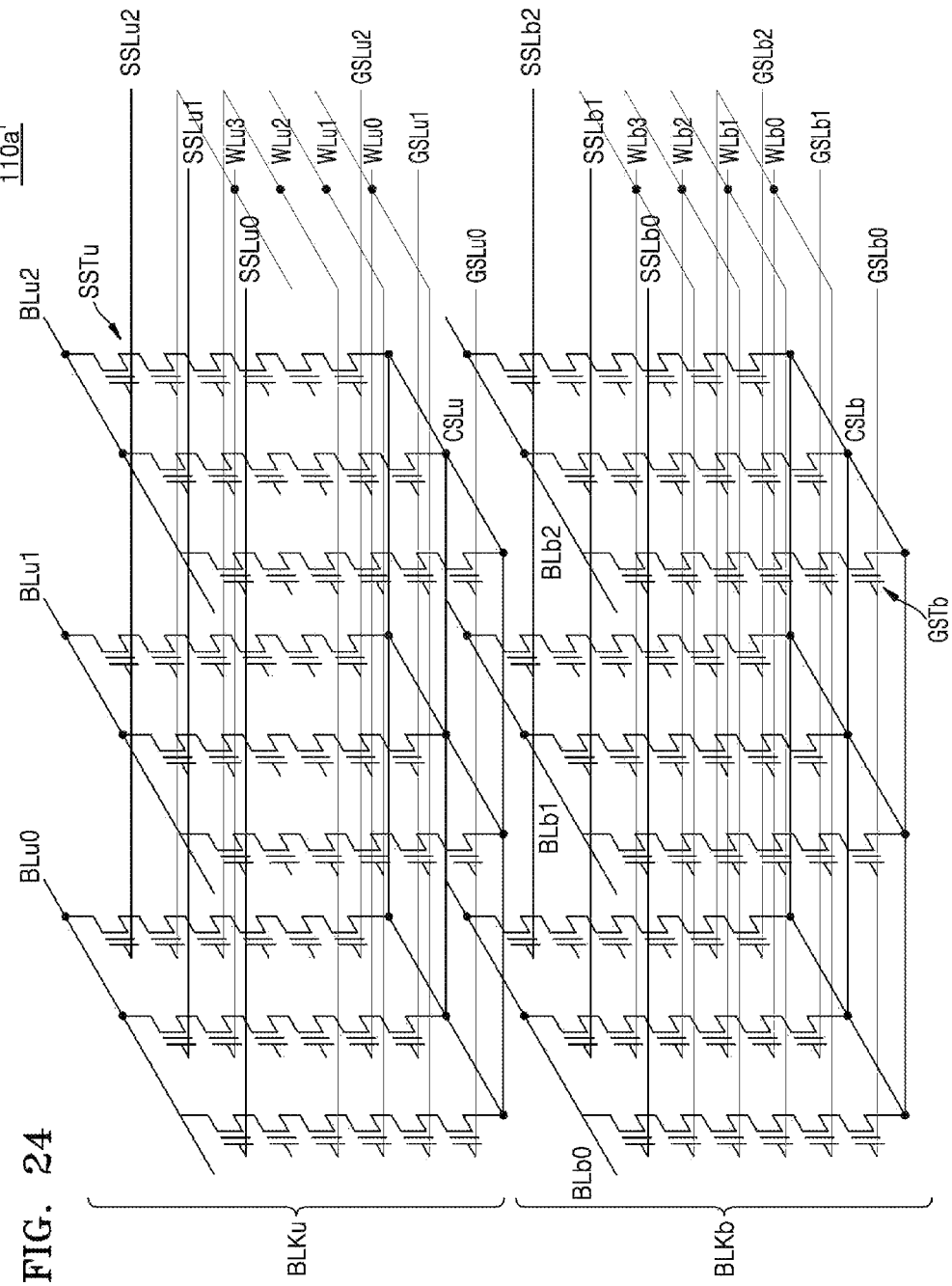
FIG. 24 is a circuit diagram illustrating an example of a memory cell array of FIG. 4.

FIG. 24 is a circuit diagram illustrating an example 110' of a memory cell array of FIG. 4. Referring to FIG. 24, the memory cell array 110' may include multiple blocks BLKb and BLKu which are vertically arranged. In detail, the memory cell array 110' may include a bottom block BLKb disposed on the substrate and an upper block BLKu disposed on the bottom block BLKb. Each of the bottom block BLKb and the upper block BLKu may be an NAND flash memory having a vertical structure.

The bottom block BLKb may include multiple NAND strings, multiple word lines WLb0 to WLb3, multiple bit lines BLb0 to BLb2, multiple ground selection lines GSLb0 to GSLb2, multiple string selection lines SSLb0 to SSLb2, and a common source line CBLb. Here, the number of the NAND strings, the number of the word lines, the number of the bit lines, the number of the ground selection lines, and the number of the string selection lines may be different in other embodiments.

The upper block BLKu may include multiple NAND strings, multiple word lines WLu0 to WLu3, multiple bit lines BLu0 to BLu2, multiple ground selection lines GSLu0 to GSLu2, multiple string selection lines SSLu0 to SSLu2, and a common source line CBLu. Here, the number of the NAND strings, the number of the word lines, the number of the bit lines, the number of the ground selection lines, and the number of the string selection lines may be different in other embodiments.

As described above, the bottom block BLKb and the upper block BLKu may be implemented substantially similar to each other, and may be implemented substantially similar to the first block BLK1 illustrated in FIG. 5. A diameter of a channel hole included in a memory cell connected to a first word line WLb0 of the bottom block BLKb may be substantially similar to that of a channel hole included in a memory cell connected to a first word line WLu0 of the upper block BLKu and may be relatively small. Also, a diameter of a channel hole included in a memory cell connected to a fourth word line WLb3 of the bottom block BLKb may be substantially similar to that of a channel hole included in a memory cell connected to a fourth word line WLu3 of the upper block BLKu and may be relatively large.

Therefore, according to this embodiment, an application duration and/or a voltage level of a pre-programming voltage supplied to the first word line WLb0 of the bottom block BLKb may be substantially similar to an application duration and/or a voltage level of a pre-programming voltage supplied to the first word line WLu0 of the upper block BLKu corresponding thereto. In this case, a distance between the first word line WLu0 of the upper block BLKu and the substrate may be greater than a distance between the first word line WLb0 of the bottom block BLKb and the substrate, yet a pre-programming voltage applied to the first word line WLu0 may be substantially the same as a pre-programming voltage applied to the first word line WLb0.

Moreover, an application duration and/or a voltage level of a pre-programming voltage supplied to an upper word line WLb3 of the bottom block BLKb may be substantially similar to an application duration and/or a voltage level of a pre-programming voltage supplied to an upper word line WLu3 of the upper block BLKu corresponding thereto. In this case, a distance between a fourth word line WLu3 of the upper block BLKu and the substrate may be greater than a distance between a fourth word line WLb3 of the bottom block BLKb and the substrate, yet a pre-programming voltage applied to the fourth word line WLu3 may be substantially the same as a pre-programming voltage applied to the fourth word line WLb3.

For example, according to this embodiment, a control logic (for example, 120 of FIG. 4) may be configured to generate a pre-programming control signal so that application durations and/or voltage levels of pre-programming voltages, supplied to respective word lines disposed on levels of the bottom block BLKb and the upper block BLKu corresponding to each other, are the same. Therefore, according to this embodiment, an application duration and/or a voltage level of a pre-programming voltage may not constantly increase depending on a distance between the substrate and each word line, and may be individually determined in consideration of the distance between the substrate and each word line relative to memory cells in the NAND string and/or the particular block.

Figure 25:
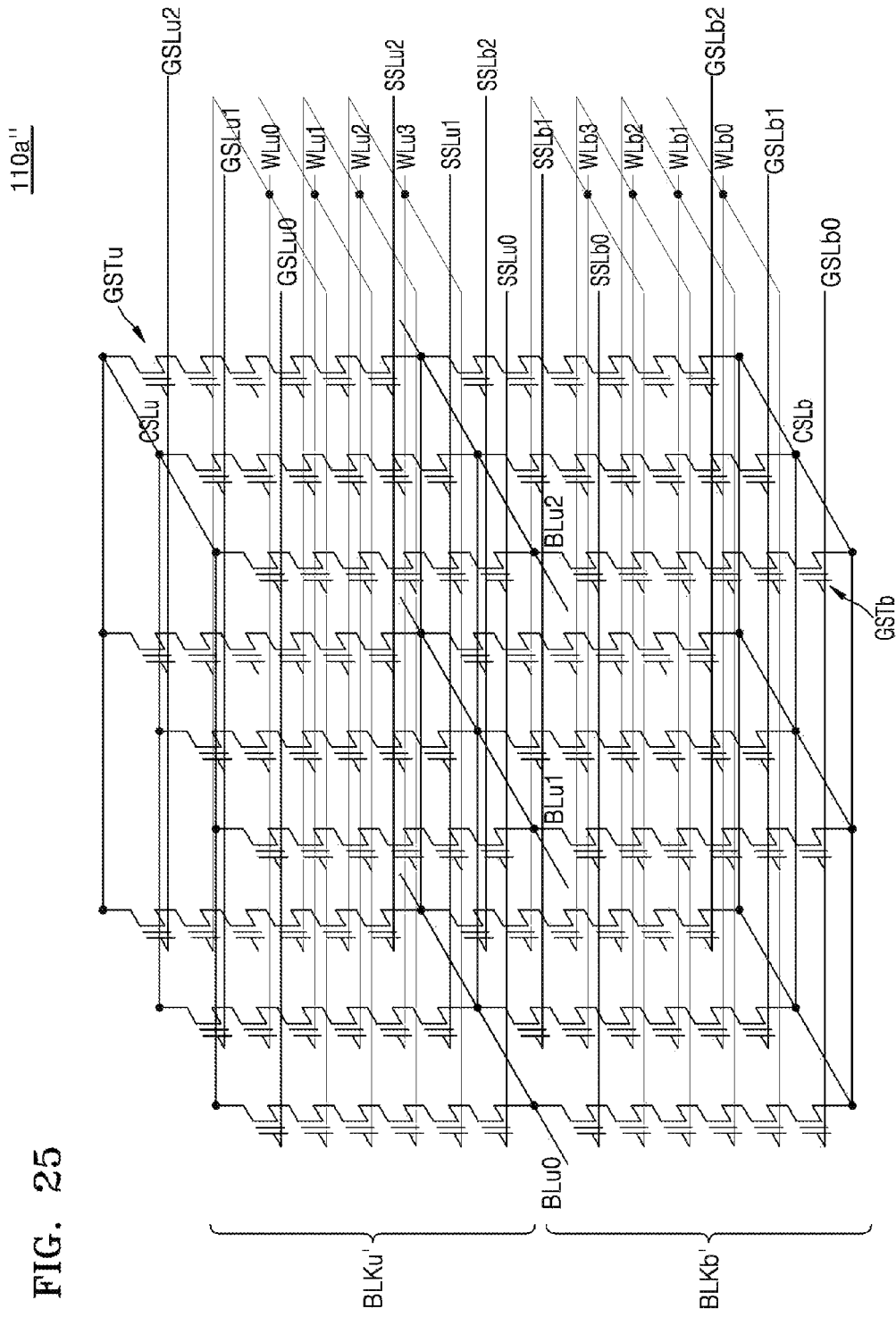
FIG. 25 is a circuit diagram illustrating another example of a memory cell array of FIG. 4.

FIG. 25 is a circuit diagram illustrating another example of a memory cell array of FIG. 4. Referring to FIG. 25, the memory cell array 110'' may include multiple blocks BLKb' and BLKu' which are vertically arranged. In detail, the memory cell array 110'' may include a bottom block BLKb' disposed on the substrate and an upper block BLKu' disposed on the bottom block BLKb'. Each of the bottom block BLKb' and the upper block BLKu' may be an NAND flash memory having a vertical structure. The memory cell array 110'' according to this embodiment is a modification of the memory cell array 110' of FIG. 24, and thus, a difference therebetween will be described below in detail and description of similar features may be omitted.

The bottom block BLKb' may include multiple NAND strings, multiple word lines WLb0 to WLb3, multiple bit lines BLb0 to BLb2, multiple ground selection lines GSLb0 to GSLb2, multiple string selection lines SSLb0 to SSLb2, and a common source line CBLb. Here, the number of the NAND strings, the number of the word lines, the number of the bit lines, the number of the ground selection lines, and the number of the string selection lines may be different in other embodiments.

The upper block BLKu' may include multiple NAND strings, multiple word lines WLu0 to WLu3, multiple bit lines BLu0 to BLu2, multiple ground selection lines GSLu0 to GSLu2, multiple string selection lines SSLu0 to SSLu2, and a common source line CBLu. Here, the number of the NAND strings, the number of the word lines, the number of the bit lines, the number of the ground selection lines, and the number of the string selection lines may be different in other embodiments.

As described above, the upper block BLKu' may be implemented in a form where the bottom block BLKb' is reversed in a vertical direction with respect to the substrate, and the upper block BLKu' and the bottom block BLKb' may share the bit lines BLb0 to BLb2. Also, the upper block BLKu' and the bottom block BLKb' may share word lines corresponding to each other according to a distance from the substrate. For example, the word line WLu3 may be connected to the word line WLb0, the word line WLu2 may be connected to the word line WLb1, the word line WLu1 may be connected to the word line WLb2, and the word line WLu0 may be connected to the word line WLb3.

According to this embodiment, the same pre-programming voltage may be applied to a first word line WLb0 of the bottom block BLKb' and a fourth word line WLu3 of the upper block BLKu'. Also, the same pre-programming voltage may be applied to a fourth word line WLb3 of the bottom block BLKb' and a first word line WLu0 of the upper block BLKu'. For example, an application duration and/or voltage level of each of pre-programming voltages respectively supplied to the word lines of the bottom block BLKb' may increase as a distance to the substrate increases, and an application duration and/or voltage level of each of pre-programming voltages respectively supplied to the word lines of the upper block BLKu' may also increase as a distance to the substrate increases, even though the orientation of the upper block BLKu' is inverted relative to the bottom block BLKb'.

In detail, according to this embodiment, a control logic (for example, 120 of FIG. 4) may generate a pre-programming control signal so that application durations and/or voltage levels of pre-programming voltages, supplied to respective word lines disposed on levels of the bottom block BLKb' and the upper block BLKu' corresponding to each other, are the same. Therefore, according to this embodiment, an application duration and/or a voltage level of a pre-programming voltage may increase depending on a distance between the substrate and each word line within each block.

Figure 26:
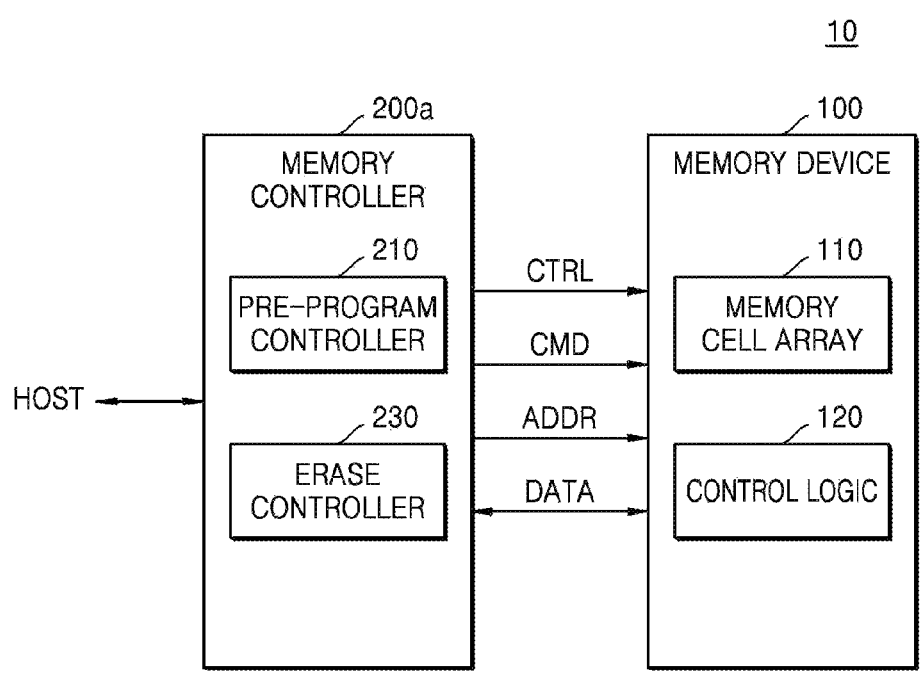
FIG. 26 is a block diagram schematically illustrating a memory system according to an embodiment.

FIG. 26 is a block diagram schematically illustrating a memory system 20 according to an embodiment. Referring to FIG. 26, the memory system 20 may include a memory device 100 and a memory controller 200a, and the memory device 100 may include a memory cell array 110 and control logic 120. The memory device 100 according to this embodiment may be implemented substantially similar to the memory device 100 of FIG. 1. Therefore, the details described above with reference to FIGS. 1 to 25 may be applied to the present embodiment, and repetitive descriptions are not repeated.

The memory controller 200a may include a pre-program controller 210 and an erase controller 230. However, a configuration of the memory controller 200a is not limited thereto, and the pre-program controller 210 and the erase controller 230 may be implemented as one block.

The pre-program controller 210 may be configured to generate a pre-programming control signal for allowing a pre-program operation to be performed on at least some of memory cells for which an erase operation is to be performed, and transmit the generated pre-programming control signal to the memory device 100 by using a command, an address, data, and/or a control signal. In this embodiment, the pre-program controller 210 may be configured to individually determine pre-programming voltages respectively supplied to word lines, based on a distance between a substrate and each of the word lines or other structural differences that change operating characteristics and may generate the pre-programming control signal according to the determined pre-programming voltages. Therefore, voltage levels and/or application durations of pre-programming voltages respectively supplied to two adjacent word lines may differ.

Moreover, the pre-program controller 210 may be configured to change the pre-programming control signal, based on program/erase cycle count. In detail, when the program/erase cycle count is equal to or greater than a threshold value, the pre-program controller 210 may be configured to change the pre-programming control signal for reducing a voltage level and/or an application duration of a pre-programming voltage. In this case, the pre-program controller 210 may be configured to change the pre-programming control signal to cause a reduction amount of a voltage level and/or an application duration of a pre-programming voltage, supplied to a lower word line, to be greater than a reduction amount of a voltage level and/or an application duration of a pre-programming voltage supplied to an upper word line.

The erase controller 230 may be configured to generate an erase control signal for allowing an erase operation to be performed on the memory cells after the pre-program operation is performed, and transmit the generated erase control signal to the memory device 100 by using a command, an address, data, and/or a control signal.

Although not shown, the memory controller 200a may further include a soft-program controller. The soft-program controller may be configured to individually determine soft-programming voltages respectively supplied to the word lines, based on levels of the word lines, thereby generating a soft-programming control signal. The soft-program controller may be configured to transmit the generated soft-programming control signal to the memory device 100 by using a command, an address, data, and/or a control signal.

Figure 27:
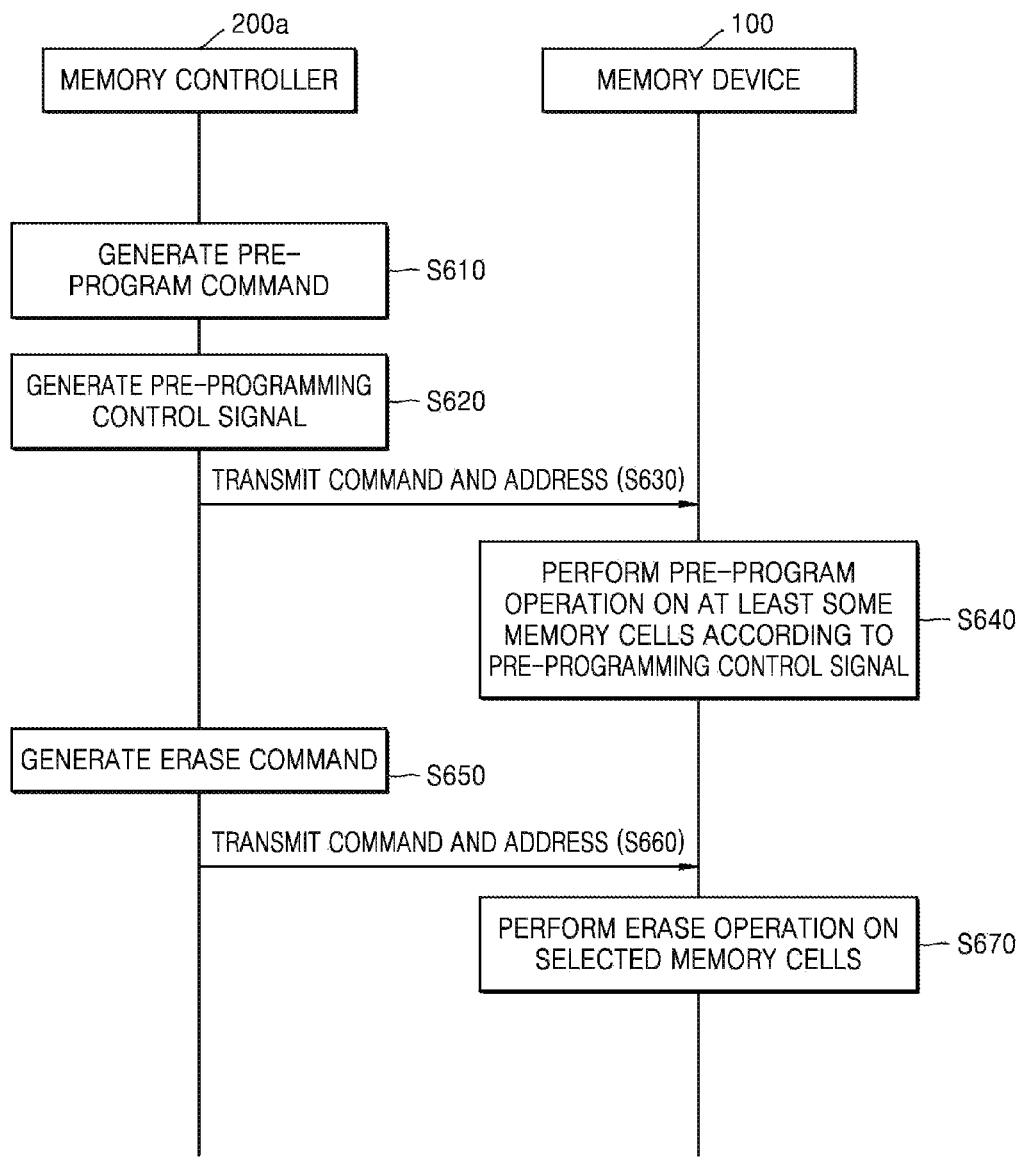
FIG. 27 is a flowchart illustrating operations of a memory controller and a memory device according to some embodiments.

FIG. 27 is a flowchart illustrating operations of a memory controller 200a and a memory device 100 according to an embodiment. Referring to FIG. 27, in operation S610, the memory controller 200a may generate a pre-program command. In operation S620, the memory controller 200a may generate a pre-programming control signal. In detail, the memory controller 200a may generate the pre-programming control signal for allowing a pre-program operation to be performed on at least some of memory cells for which an erase operation is to be performed.

In operation S630, the memory controller 200a may transmit a command and an address to the memory device 100. In this case, the generated pre-programming control signal may be transmitted to the memory device 100 by using a command, an address, data, and/or a control signal. In operation S640, the memory device 100 may perform the pre-program operation on the at least some memory cells according to the transmitted pre-programming control signal.

In operation S650, the memory controller 200a may generate an erase command. In operation S660, the memory controller 200a may transmit the command and the address to the memory device 100. In operation S670, the memory device 100 may perform the erase operation on selected memory cells in response to the transmitted command and address.

Figure 28:
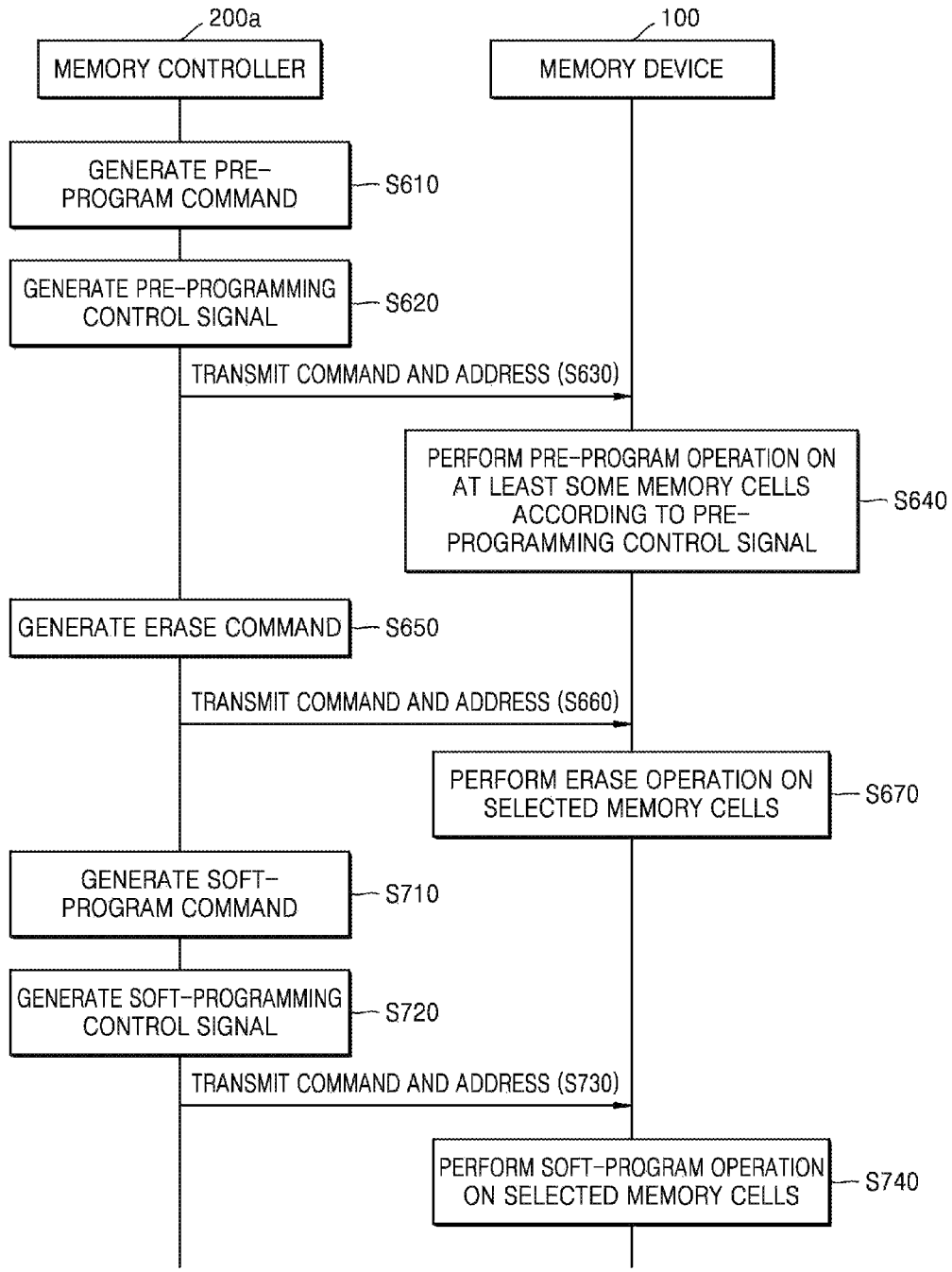
FIG. 28 is a flowchart illustrating operations of a memory controller and a memory device according to some embodiments.

FIG. 28 is a flowchart illustrating operations of a memory controller 200a and a memory device 100 according to some embodiments. Referring to FIG. 28, a method according to this embodiment may include operations which are performed after operation S670 of FIG. 27. Thus, the details described above with reference to FIG. 27 may be applied to the present embodiment, and repetitive descriptions are not repeated.

In operation S710, the memory controller 200a may generate a soft-program command. In operation S720, the memory controller 200a may generate a soft-programming control signal. In detail, the memory controller 200a may generate the soft-programming control signal for allowing a soft-program operation to be performed on at least some of memory cells for which an erase operation is to be performed.

In operation S730, the memory controller 200a may transmit a command and an address to the memory device 100. In this case, the generated soft-programming control signal may be transmitted to the memory device 100 by using a command, an address, data, and/or a control signal. In operation S740, the memory device 100 may perform the soft-program operation on the at least some memory cells according to the transmitted soft-programming control signal.

Figure 29:
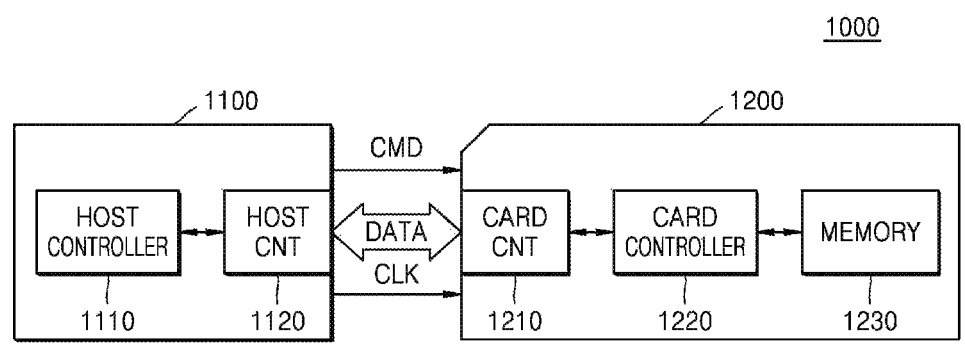
FIG. 29 is a block diagram illustrating an example where a memory device according to some embodiments is used in a memory card system.

FIG. 29 is a block diagram illustrating an example where a memory device according to some embodiments is used in a memory card system 1000. Referring to FIG. 29, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be implemented by using the embodiments of FIGS. 1 to 28.

For example, the memory card 1200 may be configured to perform a pre-program operation before performing an erase operation. In this case, the pre-program operation may be performed according to a pre-programming control signal for individually controlling the pre-program operation on memory cells, based on a distance between a substrate and each of word lines or other differences in operating characteristics. Therefore, a difference in an operating characteristic of the memory cells caused by a difference between the geometric shapes of the memory cells based on the distance between the substrate and each of word lines or other structural differences is compensated. Although a program speed/erase speed corresponding to a memory cell where a diameter of a channel hole is smaller or a thickness of a tunneling insulation layer is thinner is faster, the pre-program operation may be performed based on the pre-programming control signal, and thus, threshold voltages of memory cells included in a NAND string may correspond to the substantially same program state.

The host 1100 may be configured to write data in the memory card 1200 or read data stored in the memory card 1200. The host controller 1110 may be configured to transmit a command CMD, a clock signal CLK generated by a clock generator (not shown) included in the host 1100, and data DATA to the memory card 1200 through the host connector 1120.

In response to the command received through the card connector 1210, the card controller 1220 may be configured to store data in the memory device 1230 in synchronization with a clock signal generated by a clock generator (not shown) included in the card controller 1220. The memory device 1230 may be configured to store data transmitted from the host 1100.

The memory card 1200 may be implemented with a compact flash card (CFC), a Microdrive, a smart media card (SMC), a multimedia card (MMC), a security digital card (SDC), a memory stick, a universal serial bus (USB) flash memory driver, and/or the like.

Figure 30:
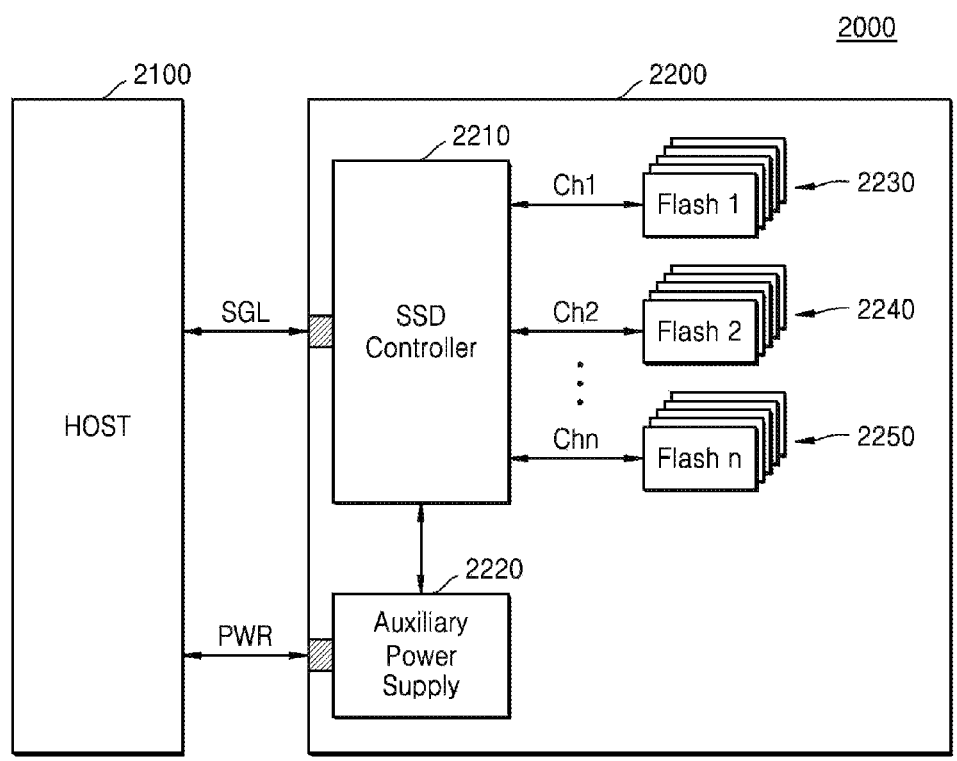
FIG. 30 is a block diagram illustrating an example where a memory device according to some embodiments is used in a solid state disk (SSD) system.

FIG. 30 is a block diagram illustrating an example where a memory device according to some embodiments is used in a solid state disk (SSD) system 2000. Referring to FIG. 30, the SSD system 2000 may include a host 2100 and an SSD 2200. The SSD 2200 may be configured to transmit or receive a signal to or from the host 2100 through a signal connector and receive power through a power connector. The SSD 2200 may include an SSD controller 2210, an auxiliary power device 2220, and multiple memory devices 2230, 2240 and 2250. In this case, the SSD 2200 may be implemented by using the embodiments of FIGS. 1 to 29.

In detail, each of the memory devices 2230, 2240 and 2250 may be configured to perform a pre-program operation before performing an erase operation. In this case, the pre-program operation may be performed according to a pre-programming control signal for individually controlling the pre-program operation on memory cells, based on a distance between a substrate and each of word lines. Therefore, a difference between an operating characteristic of the memory cells caused by a difference between the geometric shapes of the memory cells based on the distance between the substrate and each of word lines or other structural differences is compensated. Although a program speed/erase speed corresponding to a memory cell where a diameter of a channel hole is small or a thickness of a tunneling insulation layer is thin is fast, the pre-program operation may be performed based on the pre-programming control signal, and thus, threshold voltages of memory cells included in a NAND string may correspond to the substantially same program state.

A memory card, a nonvolatile memory device, and a card controller according to an embodiment may be mounted by using various types of packages. For example, a flash memory device and/or a memory controller according to an embodiment may be mounted by using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), wafer-level processed stack package (WSP), and/or the like.

Some embodiments include a memory device including a memory cell array including multiple NAND strings each including multiple memory cells respectively connected to multiple word lines vertically stacked on a substrate; and a control logic configured to generate a pre-programming control signal for pre-programming at least some of the memory cells, wherein the control logic generates the pre-programming control signal based on respective distances between the substrate and word lines for pre-programming the at least some memory cells from among the word lines, before erasing the memory cells.

Some embodiments include a memory system including a memory device including a memory cell array including multiple NAND strings each including multiple memory cells respectively connected to multiple word lines vertically stacked on a substrate, and a memory controller configured to control the memory device to pre-program at least some of the memory cells before erasing the memory cells, and generate a pre-programming control signal for pre-programming the at least some memory cells, based on respective distances between the substrate and word lines for pre-programming the at least some memory cells from among the word lines.

Some embodiments include a method of operating a memory device, which includes multiple NAND strings each including multiple memory cells respectively connected to multiple word lines vertically stacked on a substrate, includes generating a pre-programming control signal for pre-programming the memory cells, based on respective distances between the substrate and the word lines, pre-programming memory cells respectively connected to at least some of the word lines by respectively applying pre-programming voltages to the at least some word lines, based on the pre-programming control signal, and performing an erase operation on the memory cells.

Some embodiments include a method of operating a memory system, which includes a memory device including multiple NAND strings each including multiple memory cells respectively connected to multiple word lines vertically stacked on a substrate and a memory controller controlling the memory device, includes: generating, by the memory controller, a pre-programming control signal for pre-programming the memory cells, based on respective distances between the substrate and word lines for pre-programming the memory cells from among the word lines; transmitting, by the memory controller, the generated pre-programming control signal to the memory device; pre-programming memory cells respectively connected to at least some of the word lines by respectively applying pre-programming voltages to the at least some word lines, based on the pre-programming control signal; generating, by the memory controller, an erase command for erasing the memory cells; transmitting, by the memory controller, the generated erase command to the memory controller; and erasing the memory cells in response to the erase command.

While embodiments have been particularly shown and described with reference to particular embodiments, it will be understood that various changes in form and details may be made therein without departing from the spirit and scope of the following claims.

What is claimed is:
1. A memory device, comprising:
a memory cell array including a plurality of NAND strings, each NAND string including a plurality of memory cells respectively connected to a plurality of word lines vertically stacked on a substrate; and
a control logic configured to generate a pre-programming control signal for pre-programming at least some of the plurality of memory cells before erasing the plurality of memory cells,
wherein the control logic generates the pre-programming control signal by determining application durations of pre-programming voltages or voltage levels of pre-programming voltages respectively supplied to the plurality of word lines while a pre-program operation is being performed, based on respective distances between the substrate and the plurality of word lines.

2. The memory device of claim 1,
wherein the control logic is further configured to generate the pre-programming control signal such that a first application duration of a first pre-programming voltage supplied to a first word line of the plurality of word lines adjacent to the substrate is shorter than a second application duration of a second pre-programming voltage supplied to a second word line of the plurality of word lines above the first word line.

3. The memory device of claim 2,
wherein when a program/erase cycle count is equal to or greater than a threshold value, the control logic is configured to generate the pre-programming control signal to shorten the first application duration and the second application duration, and
wherein a first amount the first application duration is changed is larger than a second amount the second application duration is changed.

4. The memory device of claim 1,
wherein the pre-programming control signal comprises a row address activation times that differ among the plurality of word lines, and
wherein the memory device further comprises a row decoder connected to the memory cell array to select at least some word lines from among the plurality of word lines in response to a row address.

5. The memory device of claim 1,
wherein the control logic is further configured to generate the pre-programming control signal such that the application durations of the pre-programming voltages are based on an operating characteristic of the at least some of the plurality of memory cells.

6. The memory device of claim 1,
wherein the control logic is further configured to generate the pre-programming control signal such that a first voltage level of a first pre-programming voltage supplied to a first word line of the plurality of word lines adjacent to the substrate is lower than a second voltage level of a second pre-programming voltage supplied to a second word line of the plurality of word lines above the first word line.

7. The memory device of claim 6,
wherein when a program/erase cycle count is equal to or greater than a threshold value, the control logic is configured to generate the pre-programming control signal to lower the first and second voltage levels, and wherein a first amount the first voltage level is changed is larger than a second amount the second voltage level is changed.

8. The memory device of claim 1, wherein the pre-programming control signal comprises a voltage control signal having voltage levels that differ among the word lines, and wherein the memory device further comprises a voltage generator configured to generate, in response to the voltage control signal, a plurality of pre-programming voltages having different voltage levels.

9. The memory device of claim 1, wherein the control logic is further configured to generate a soft-programming control signal based on an operating characteristic of the at least some of the plurality of memory cells.

10. The memory device of claim 9, wherein the control logic is further configured to generate the soft-programming control signal based on the pre-programming control signal.

11. The memory device of claim 1, wherein a plurality of memory cells of a first NAND string of the plurality of NAND strings vary among the NAND strings has structural variations, and wherein operating characteristics of the plurality of memory cells vary based on the structural variations.

12. The memory device of claim 11, wherein a second NAND string of the plurality of NAND strings is disposed on the substrate above the first NAND string, and wherein the control logic is further configured to generate a pre-programming control signal for a plurality of memory cells of the second NAND string such that pre-programming voltages applied to the plurality of word lines coupled to corresponding memory cells of the first NAND string correspond to pre-programming voltages applied to the plurality of word lines coupled to corresponding memory cells of the second NAND string on a one-to-one basis.

13. A memory system comprising:

a memory device including a memory cell array including a plurality of NAND strings, each NAND string including a plurality of memory cells respectively connected to a plurality of word lines vertically stacked on a substrate; and a memory controller configured to control the memory device to pre-program at least some of the memory cells before erasing the plurality of memory cells, wherein the memory controller controls the memory device to determine application durations of pre-programming voltages or voltage levels of pre-programming voltages respectively supplied to the plurality of word lines while a pre-program operation is being performed, based on respective distances between the substrate and the plurality of word lines.

14. The memory system of claim 13, wherein the memory controller is further configured to control the memory device to determine application durations of pre-programming voltages or voltage levels of pre-programming voltages respectively supplied to the plurality of word lines.

15. The memory system of claim 14, wherein the memory controller is further configured to control the memory device such that a first pre-programming voltage is supplied to a first word line of the plurality of word lines adjacent to a substrate for a first application duration and a second pre-programming voltage is supplied to a second word line of the plurality of word lines above the first word line for a second application duration, wherein the first application duration is shorter than the second application duration and wherein the first pre-programming voltage is lower than the second pre-programming voltage.

16. The memory system of claim 15, wherein when a program/erase cycle count is equal to or greater than a threshold value the memory controller is further configured to control the memory device such that the first application duration is changed a greater amount than the second application duration is changed and the first pre-programming voltage is changed a larger amount than the second pre-programming voltage is changed.

17. The memory system of claim 13, wherein the memory controller is further configured to control the memory device to soft-program the plurality of memory cells after performing an erase operation, based on an operating characteristic of the plurality of memory cells.

18. The memory system of claim 13, wherein the pre-programming voltages include a first pre-programming voltage supplied to a first word line of the plurality of word lines adjacent to a substrate and a second pre-programming voltage supplied to a second word line of the plurality of word lines above the first word line, and wherein the first pre-programming voltage is lower than the second pre-programming voltage.

19. The memory system of claim 18, wherein if a program/erase cycle count is equal to or greater than a threshold value, the memory controller is further configured to control the memory device such that the first pre-programming voltage is changed a larger amount than the second pre-programming voltage is changed.

* * * * *